United States Patent
Chan et al.

(10) Patent No.: US 9,142,779 B2
(45) Date of Patent: Sep. 22, 2015

(54) PATTERNING OF OLED MATERIALS

(71) Applicants: University of Rochester, Rochester, NY (US); eMagin Corporation, Hopewell Junction, NY (US)

(72) Inventors: Charles K. Chan, Rochester, NY (US); Ching W. Tang, Brighton, NY (US); Fridrich Vazan, Hopewell Junction, NY (US); Amal Ghosh, Hopewell Junction, NY (US)

(73) Assignees: University of Rochester, Rochester, NY (US); eMagin Corporation, Hopewell Junction, MA (US)

( * ) Notice: Subject to any disclaimer, the term of this patent is extended or adjusted under 35 U.S.C. 154(b) by 0 days.

(21) Appl. No.: 14/453,480

(22) Filed: Aug. 6, 2014

(65) Prior Publication Data

US 2015/0041793 A1 Feb. 12, 2015

Related U.S. Application Data

(60) Provisional application No. 61/862,685, filed on Aug. 6, 2013.

(51) Int. Cl.
*H01L 21/00* (2006.01)
*H01L 21/40* (2006.01)
*H01L 51/00* (2006.01)
*H01L 27/32* (2006.01)
*H01L 51/56* (2006.01)

(52) U.S. Cl.
CPC ........ *H01L 51/0018* (2013.01); *H01L 27/3211* (2013.01); *H01L 51/56* (2013.01)

(58) Field of Classification Search
USPC ......... 438/29, 71, 99; 257/E21.023, E21.038, 257/E21.039, E21.058
See application file for complete search history.

(56) References Cited

U.S. PATENT DOCUMENTS

2005/0212419 A1* 9/2005 Vazan et al. .................. 313/512
2007/0099395 A1* 5/2007 Sridhar et al. ................ 438/460

* cited by examiner

*Primary Examiner* — Mohsen Ahmadi
(74) *Attorney, Agent, or Firm* — Hodgson Russ LLP

(57) ABSTRACT

A method of making a patterned OLED layer or layers. The method uses a shadow mask having, for example, a free-standing silicon nitride membrane to pattern color emitter material with a feature size of less than 10 microns. The methods can be used, for example, in the manufacture of OLED microdisplays.

6 Claims, 51 Drawing Sheets

PATTERNING OF OLED MATERIALS

CROSS-REFERENCE TO RELATED APPLICATIONS

This application claims priority to U.S. provisional patent application No. 61/862,685, filed Aug. 6, 2014, the disclosure of which is incorporated herein by reference.

FIELD OF THE DISCLOSURE

The present disclosure generally relates to methods for making one or more organic light-emitting diode (OLED) emitter layers. More particularly, the present disclosure relates to direct patterning of one or more OLED layers using shadow masks.

BACKGROUND OF THE DISCLOSURE

The OLED diode structure was discovered in 1987, and has been developed into a technology that is used for displays in cellphones, microdisplays and televisions. Microdisplays are small displays that are used under magnification or for projection applications. Some of the applications of microdisplays are camera viewfinders and wearable displays, specifically for professions that require hands free information or for virtual reality applications. Google Glass, currently in development, could usher in mass market microdisplays.

One feature that differentiates microdisplays from normal displays is that the pixel density of microdisplays is much greater than normal displays. An example of normal displays with high pixel densities are the displays on the Samsung Galaxy S4 and the HTC One with 441 and 468 pixels per inch (PPI), respectively. Pixel densities on some microdisplays such as eMagin SXGA and Holoeye HED 6001 have 2646 and 3175 PPI, respectively, about an order of magnitude higher in PPI than normal displays.

Most microdisplays are fabricated on single crystal silicon substrates using CMOS technology. For most microdisplays, liquid crystals (LC) with backlighting are used, but a growing segment of microdisplays are based on organic light emitting diodes (OLEDs). OLED microdisplays have a few advantages over LC microdisplays: OLED is intrinsically simpler in design, does not need backlighting, has a higher viewing angle, faster response time, higher contrast, and it has a higher temperature operating range.

A full color (i.e. RGB colors) OLED display requires patterning to place individual color OLED stacks onto its respective color sub-pixels. Conventional patterning using lithography is not possible with organics due to the sensitivity of the organics to photoresist and chemistries, which is required for photoresist processing. There are few methods to pattern organics other than photoresist such as metal shadow mask, organic vapor jet deposition, and thermal dye transfer. All commercial high resolution full color OLED displays are made using shadow mask patterning in which fine metal masks (FMM) are used.

Current methods produce color emitter layers with a metal shadow mask, which suffers from resolution issues and may prevent color emitter sub-pixel sizes under 10 μm. Other methods create high-resolution OLED microdisplay RGB sub-pixels using a white OLED overlaid with a color filter. The color filters may absorb approximately 80% of the white light and reduce light output from the OLED.

BRIEF SUMMARY OF THE DISCLOSURE

By using direct patterning of OLED with stencil lithography, high-efficiency, high-resolution OLED microdisplays can be fabricated. In the embodiments disclosed herein, color emitter deposition for OLED uses a shadow mask that can have nm scale features. The shadow masks have precision and accuracy to match the underlying transistor of the microdisplay and create color emitters at higher resolution.

As seen in FIG. 27, a flat substrate, such as a silicon wafer, is used to build a shadow mask. A thin film, such as silicon nitride, is deposited on both sides of the substrate using chemical vapor deposition (CVD). This silicon nitride layer may function as an etch barrier on one side and a free-standing membrane on the other side. Silicon oxide, aluminum oxide, or other thin film materials also may be used instead of the silicon nitride. One side of the thin film is etched to expose the substrate for a subsequent through substrate etch process. For example, the silicon nitride may be patterned using photolithography and dry etched to remove silicon nitride. The other side of the thin film is patterned using lithography and etched to create the desired shadow mask pattern. Again, this may use photolithography with dry etch. Of course, other patterning methods may be used.

The through substrate etch freely suspends the thin film, which enables the film to be used as a shadow mask. The substrate may be etched using, for example, potassium hydroxide. An image of such a fabricated shadow mask is shown in FIG. 1.

A freestanding silicon nitride film on a silicon substrate was fabricated. The chip size was approximately 20 mm by 17 mm and the freestanding membrane was approximately 16 mm by 13 mm. A light microscope image of the free standing membrane is shown in FIG. 2.

Patterned evaporation may be performed through the shadow mask. A microdisplay substrate is placed near or in contact with the shadow mask. The setup can be brought into a deposition system to evaporate material. After evaporation, there will be a patterned material on the substrate. This is illustrated in FIG. 3.

In one example, patterned Alq3 on a silicon substrate was fabricated using a shadow mask. The transfer was 1:1 without distortion. The width of the transferred pattern was 5.9 μm, almost the same size as the 6 μm features in the shadow mask. The results, shown with a fluorescent image, are shown in FIG. 4.

BRIEF DESCRIPTION OF THE FIGURES

For a fuller understanding of the nature and objects of the disclosure, reference should be made to the following detailed description taken in conjunction with the accompanying drawings, in which.

DETAILED DESCRIPTION OF THE DISCLOSURE

Figure 1:
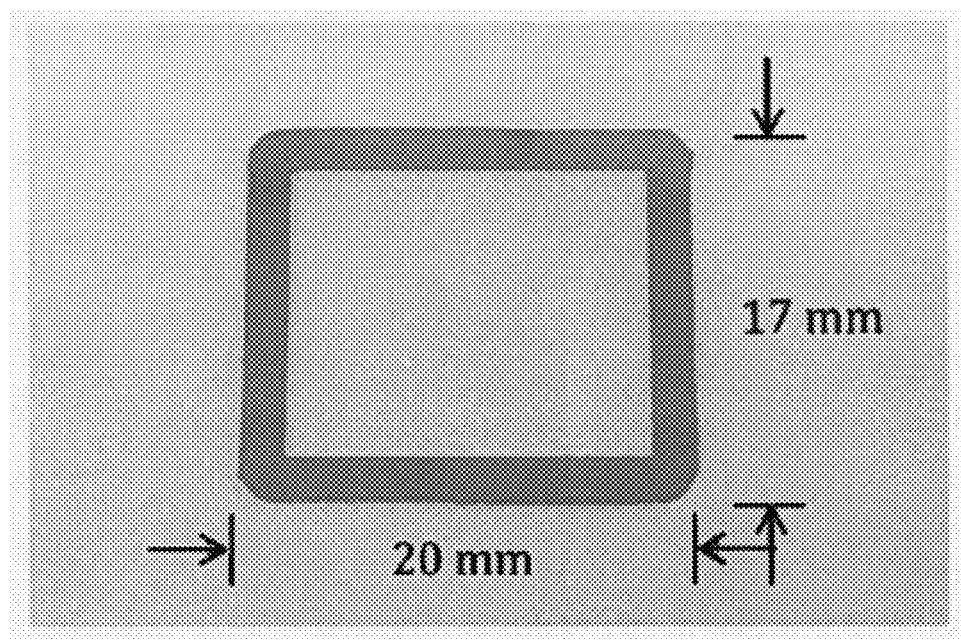
FIG. 1 is an example of an image of a fabricated shadow mask.
Figure 2:
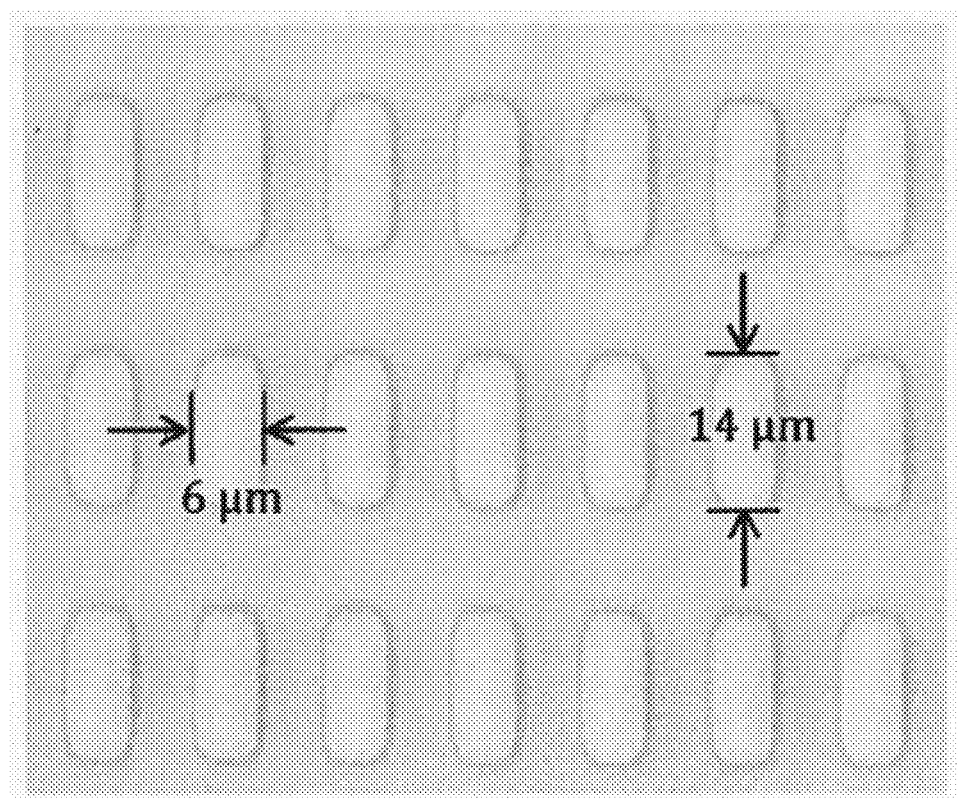
FIG. 2 is a light microscope image of an example of the free standing membrane.
Figure 3:
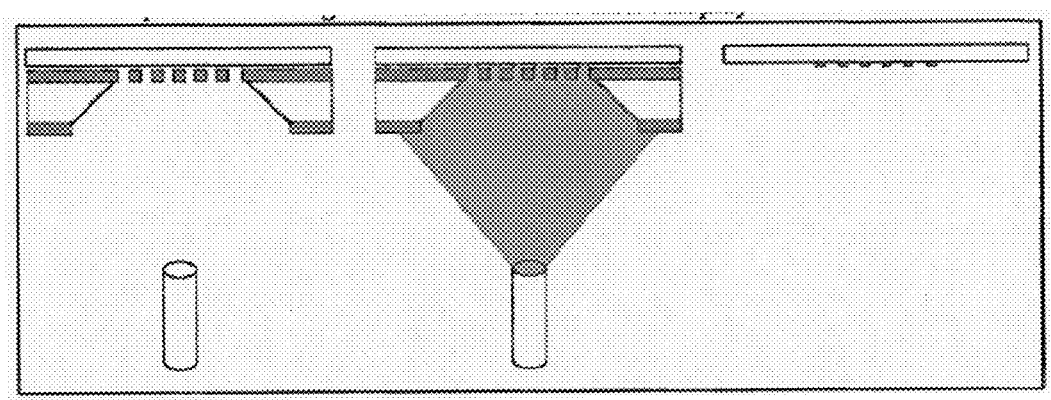
FIG. 3 illustrates deposition through a shadow mask.
Figure 4:
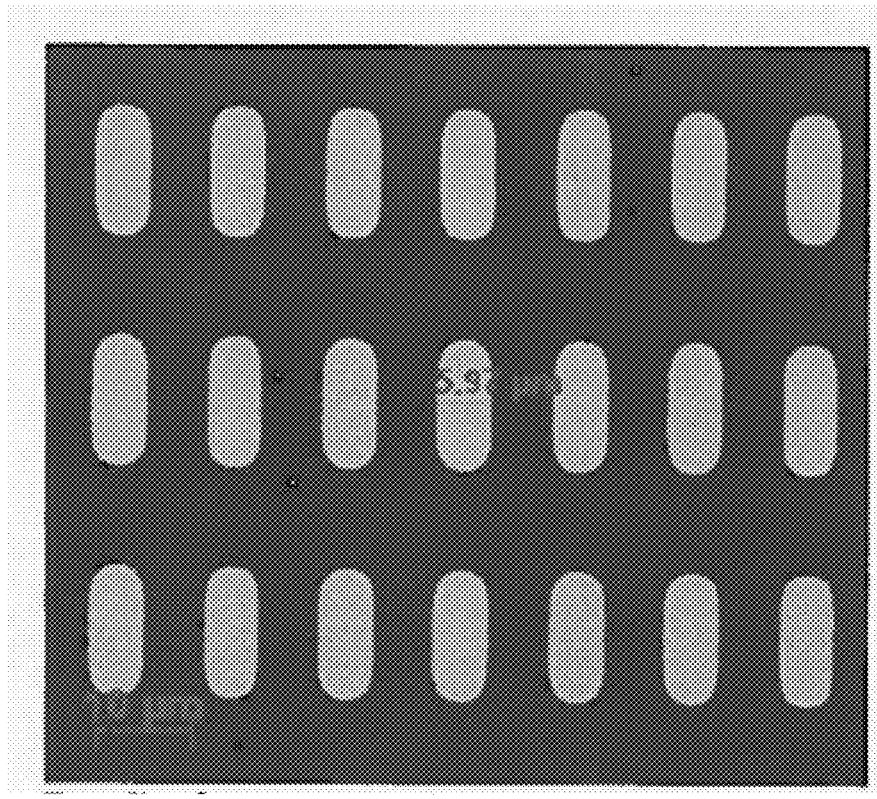
FIG. 4 is an image of an example of a silicon substrate fabricated using a shadow mask.

The present disclosure provides methods for making color emitter layers (e.g., patterned structures of one or more color emitter materials). The methods use shadow masks to pattern color emitter materials. For example, the shadow masks have a free-standing silicon nitride membrane. Also provided are patterned structures of color emitter materials and devices comprising patterned structures of color emitter materials, shadow masks having a free-standing membrane, and system for making patterns of color emitting structures. Using the methods disclosed herein patterns of color emitter materials having at least one dimension of less than 10 microns can be realized.

List of Symbols used herein:
a shadow mask aperture width
d straight deposition width
$d_l$ offset deposition width
$d_s$ deposition shift, the horizontal distance from the center of the aperture to the center due to offset source
g gap, the distance between the surface of the substrate and the closest surface of the shadow mask
h height, distance from the surface of the substrate to the surface of the deposition source
l offset source distance, the horizontal distance from the center of the source to the center of the aperture
s source width
t thickness of the shadow mask List of Abbreviations used herein.
AFM Atomic Force Microscope
Alq3 Tris(8-hydroxyquinoline) Aluminum
DCJTB  4-(dicyanomethylene)-2-t-butyl-6-(1,1,7,7-tetramethyljulolidyl-9-enyl)-4H-pyran
FMM Fine Metal Mask
ITO Indium Tin Oxide
LC Liquid Crystal
LPCVD Low Pressure Chemical Vapor Deposition
MBR Membrane Breakage Rate
NPB  N,N'-Di-[(1-naphthyl)-N,N'-diphenyl]-1,1'-biphenyl)-4,4'-diamine
OLED Organic Light Emitting Diode
PL Photoluminescence
PPI Pixels per Inch
RGB Red, Green, and Blue
SNM Silicon Nitride Mask
TEM Transmission Microscopy Grids In an aspect, the present disclosure provides methods for making patterned structures of color emitter materials. The methods use shadow masks to make the patterned structures. Multiple patterns of color emitter materials can be formed on a substrate. The multiple patterns maybe formed on a single surface of the substrate. In an embodiment, the patterns do not overlap. In another embodiment, the patterns at least partially overlap. In an embodiment, the patterned structures form an OLED RGB color emitter layer.

In an embodiment, the method comprises a) providing a shadow mask having a free-standing silicon nitride membrane; and b) forming a pattern of a first color emitter material on a substrate using the shadow mask. The pattern of a first color emitter material has one or more first color emitter material structures having at least one dimension of less than 10 microns.

In another embodiment, the method further comprises forming a pattern of a second color emitter material on the substrate having the pattern of the first color emitter material using a second shadow mask having a free-standing silicon nitride membrane. The pattern of the second color emitter material has one or more second color emitter material structures having at least one dimension of less than 10 microns. In an embodiment, the first color emitter material structures and second color emitter material structures do not overlap. In another embodiment, the first color emitter material structures and second color emitter material structures at least partially overlap.

In another embodiment, the method further comprising forming a pattern of a third color emitter material on the substrate having the pattern of the first color emitter material and the pattern of the second color emitter material using a third shadow mask having a free-standing silicon nitride membrane. The pattern of third color emitter material has one or more third color emitter material structures having at least one dimension of less than 10 microns. In an embodiment, the first color emitter material structures and second color emitter material structures and third color emitter material structures do not overlap. In another embodiment, the first color emitter material structures and second color emitter material structures and third color emitter material structures at least partially overlap.

The shadow mask can be formed using a method described herein. The shadow mask has a free-standing membrane. The free-standing membrane has one or more voids (also referred to herein as apertures) arranged in a desired pattern. The pattern of voids corresponds to a desired pattern of color emitter material. The membrane material can be formed from materials such as silicon nitride (e.g., LPCVD silicon nitride), silicon oxide, and aluminum oxide. In an embodiment, the membrane material is silicon nitride. In another embodiment, the membrane material is LPCVD silicon nitride. In an embodiment, the shadow mask defines apertures having at least one dimension of 2.8 µm to 14 µm, including all values to 0.1 µm and ranges therebetween.

Figure 6:
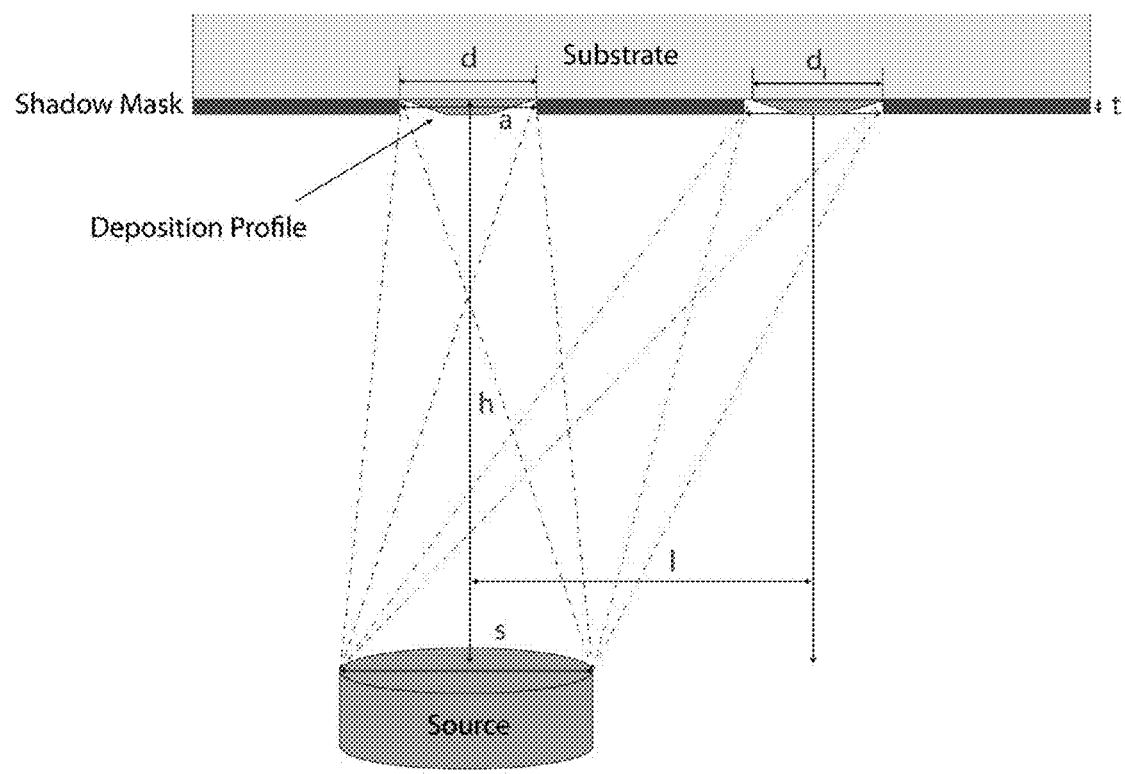
FIG. 6 is an example of a theoretical shadow mask deposition diagram for depositions with and without an offset when there is no separation between the shadow mask and substrate and where the shadow mask has straight sidewalls.

Patterning by shadow mask method is typically performed under high vacuum (<10$^{-6}$ Torr), where the mean free path length of the evaporated molecules is more than the distance between the substrate and the evaporation source, producing line-of-sight deposition. Ideally, the shadow mask should be placed extremely close or in contact with the substrate for very accurate pattern transfer of shadow mask features to the substrate. FIG. 6 shows a theoretical shadow mask deposition diagram where the shadow mask is in contact with the substrate and that the pattern transferred is nearly identical to the shadow mask aperture. During depositions with an offset source, l, a horizontal distance between center of deposition source and center of aperture, the thickness of the shadow mask, t, can begin to cause a reduction in the area of the deposition due to shadowing and may be compensated by a rotating substrate or source. An angled shadow mask edge will also prevent the reduction in the deposition area by improving the line of sight from the source to substrate.

Figure 7:
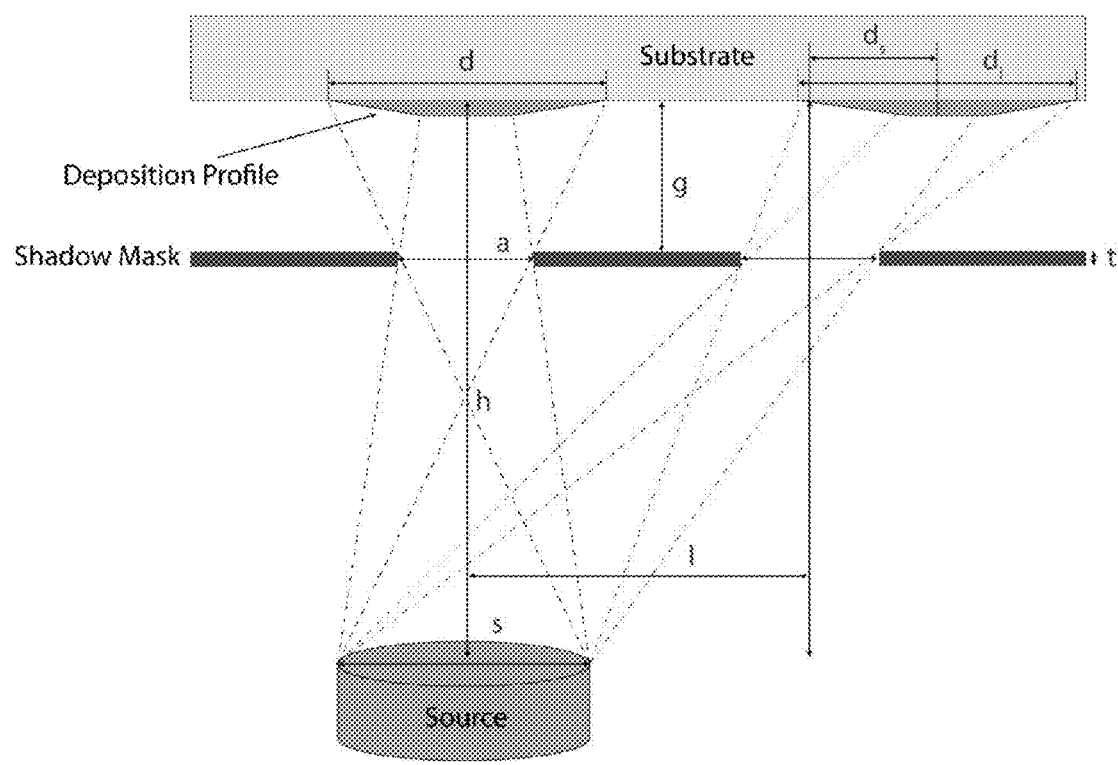
FIG. 7 is an example of a theoretical shadow mask deposition diagram for a straight and offset deposition with a gap, g, spacing between the substrate and shadow mask and where the shadow mask has straight sidewalls.

If a gap, g, the spacing between the shadow mask and silicon nitride film is required, a few issues for patterning arise such as an enlargement of the resulting pattern for depositions with and without an offset source, l. Depositions with an offset source, l, will also result in a deposition shift, d$_s$, horizontal distance from the aperture center to the deposition center. FIG. 7 shows a theoretical diagram for shadow mask deposition when a gap is introduced, along with the resulting depositions with and without an offset source, l. From FIG. 7, the deposition width, d; offset deposition width, d$_l$; and deposition shift, d$_s$, will vary with gap, g, and equations are determined.

From FIG. 7, an equation can be determined for the case of the straight deposition with a gap, g, to calculate the deposition width, d:

$$d = \frac{g(s+a)}{h-g} + a \qquad (1)$$

The variables, a, h, and s are the aperture width, distance between the surface of the substrate to the top of the deposition source, and the source width, respectively. For deposition without a gap, the deposition width is the same as the aperture width but when a gap is introduced, the deposition width increases and is determined from equation (1). With an enlargement of the deposition width due to the introduction of the gap, there needs to be a consideration for shadow mask aperture design to produce the desired deposition width. Alternatively, control of the deposition width can be done through changes in the distance between the source and substrate, and source width. For a straight deposition, the shadow mask thickness does not affect the deposition width but it will however affect the deposition profile.

For the case of an offset deposition with a gap, where the aperture edge is past the source edge (see FIG. 7), the equation for the offset deposition width, d$_l$, is:

$$d_l = \frac{g(l+0.5s+0.5a)}{h-g} - \frac{(g+t)(l-0.5s-0.5a)}{h-g-t} \qquad (2)$$

From equation (2), the offset deposition width will either be the same size or smaller than the straight deposition, width given by equation (1), with all other conditions being the same. As the thickness of the shadow mask increases, the deposition width will decrease due to the shadowing caused by the surface of the leading edge of the shadow mask. To compensate for the edge effects of the shadow mask, the shadow mask sidewall can also be angled. A rotating source to correct for edge effects in the offset deposition may result in a larger deposition width by effectively increasing the source width.

The shifted deposition from an offset source is another concern when a gap is introduced. The equation for the deposition shift, d$_s$, is:

$$d_s = \frac{d_l}{2} + \frac{(g+t)(l-0.5s-0.5a)}{h-g-t} - 0.5a \qquad (3)$$

From equation (3), the shifted deposition is mainly a function of gap. In most cases, the gap should be kept as small as possible since the enlargement and offset of the center of deposition becomes difficult to manage. In addition, the profile and uniformity of the deposition will have increasing rounded sidewalls with an increase in gap.

An example of the theoretical values for d, d$_l$, and d$_s$ with varying gap, g, is determined from equation (1), (2), and (3), respectively, and is shown in Table 1; values for the other variables are taken from the experimental setup and are: a=3 µm, d=130 mm; o=10 mm, s=5 mm, and t=1 µm.

TABLE

Theoretical values of d, d', and s$_d$ with varying gaps, g, from equation (1), (2), and (3), respectively. Other variables are taken from experimental setup.

| Gap, g (µm) | d (µm) | d$_l$ (µm) | d$_s$ (µm) |
|---|---|---|---|
| 0 | 3.00 | 2.96 | 0.03 |
| 5 | 3.38 | 3.35 | 0.40 |
| 10 | 3.77 | 3.73 | 0.79 |
| 15 | 4.15 | 4.12 | 1.17 |
| 20 | 4.54 | 4.50 | 1.56 |

From Table 1, as the gap, g, increases, d, $d_f$, and $d_s$ increases and these increases may be undesirable. The enlargement difference between d and $d_f$ is minimal based on the values for the other variables. The increase in $d_s$, grows significantly and may need to be considered based on the requirements of the patterning process. From these results, it may be ideal to keep the gap, g, as small as possible.

Color emitter materials, e.g., color emitter materials used in OLED devices, are known in the art. The color emitter materials are, for example, small molecules (e.g., metal chelates, fluorescent and phosphorescent dyes). Examples of suitable small molecules include Alq3, DCJTB, and NPB. The color emitter materials can be deposited through the shadow mask by, for example, evaporation or sputtering.

The substrate can be any substrate on which the patterned structures of color emitting materials can be formed. For example, substrates used in OLED fabrication can be used. The substrate can be part of an OLED or part of a display device, for example a microdisplay.

The pattern of color emitter material structures has at least one structure, a plurality of structures, or all of the structures having at least one dimension (e.g., diameter) of less than 10 microns. Dimensions include dimensions parallel to the surface of the substrate on which the color emitter structures are deposited. In an embodiment, the pattern of color emitter material structures has at least one structure, a plurality of the structures, or all of the structures having at least one dimension, a plurality of dimensions, or all dimensions of 0.5 µm to 9.5 µm, including all values to 0.1 µm and ranges therebetween. Multiple patterns of the same or different color emitter materials may be formed on the same surface of a substrate. In an embodiment, multiple patterns of the same or different color emitter materials are formed on the same surface of a substrate and none of the structures overlap.

The steps of the method described in the various embodiments and examples disclosed herein are sufficient to carry out the methods of the present invention. Thus, in an embodiment, the method consists essentially of a combination of the steps of the methods disclosed herein. In another embodiment, the method consists of such steps.

In an aspect, the present disclosure provides a pattern of color emitter material structures on a substrate. The pattern may be formed from multiple patterns of the same or different color emitter materials on the same surface of the substrate. In an embodiment, none of the structures overlap. In an embodiment, the pattern of color emitter material structures on a substrate are made by a method of the present disclosure. In an embodiment, the pattern of color emitter material forms a portion of an organic light-emitting diode. In another embodiment, the substrate forms a portion of a device. For example the device is a display (e.g., a microdisplay).

In an aspect, the present disclosure provides a device comprising a pattern of color emitter material structures. The pattern may be formed from multiple patterns of the same or different color emitter materials on the same surface of the substrate. In an embodiment, none of the structures overlap. In an embodiment, the pattern of color emitter material structures are made by a method of the present disclosure.

Figure 5:
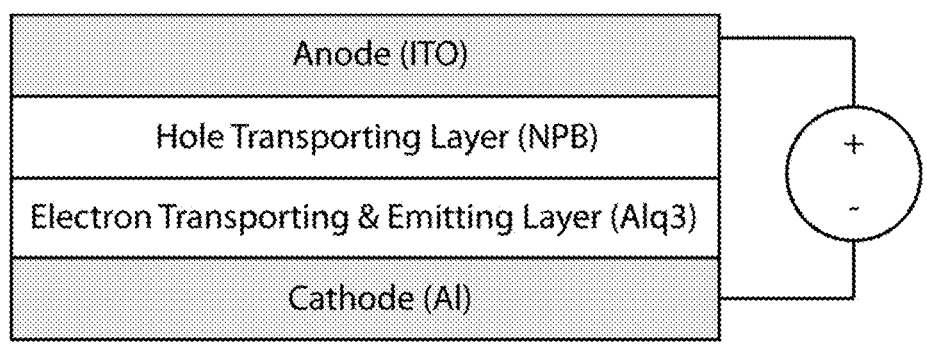
FIG. 5 is a diagram of an example of a simple OLED structure where the organic layers, the hole transporting layer and electron transporting layer are in between the anode and cathode.

In an embodiment, the pattern of color emitter material forms a portion of an organic light-emitting diode. The basic structure of an OLED is organic layers sandwiched between a cathode and an anode that provides charge injection. The organic layers typically comprise of an electron transporting layer, a hole transporting layer and an emission layer in-between the two. Simple OLED devices have light emission from either the electron or hole-transporting material. A prototypical OLED structure is an aluminum (Al) cathode, tris (8-hydroxyquinoline) aluminum (Alq3) for electron-transporting and emission layer, N,N'-Di-[(1-naphthyl)-N,N'-diphenyl]-1,1'-biphenyl)-4,4'-diamine (NPB) for hole transporting layer and indium tin oxide (ITO) anode in this order and is shown in FIG. 5. By applying a sufficient amount of voltage, holes will flow from the anode to NPB while the electrons will flow from the cathode to the Alq3 and these opposite charges will meet around the interface between the NPB and Alq3 and recombine to form excitons (excited states). The excitons will decay and emit radiation with energy characteristic of its hole and electron transport layer material. Emission in the NPB/Alq3 device typically comes from the electron-transporting Alq3 due to the lower energy gap of Alq3 compared with NPB. Doping with molecules having a smaller energy gap helps shift exciton energy in the recombination zone resulting in a red-shift in emission. An example is 4-(dicyanomethylene)-2-t-butyl-6-(1,1,7,7-tetramethyljulolidyl-9-enyl)-4H-pyran (DCJTB) in the Alq3 layer which shifts the green emission to a red emission.

In another embodiment, the substrate forms a portion of a device. For example the device is a television, computer monitor, media screen or display (e.g., a microdisplay), mobile phones, handheld game console, personal digital assistant, laptop, tablet, digital media players, solid-state lighting, or the like.

In an aspect, the present disclosure provides shadow masks. The shadow mask has a free-standing membrane. The free-standing membrane has one or more voids arranged in a desired pattern. The voids can be formed by methods known in the art (e.g., photolithography and etch processes) The pattern of voids corresponds to a desired pattern of color emitter material. The membrane material can be formed from materials such as silicon nitride (e.g., LPCVD silicon nitride), silicon oxide, and aluminum oxide. In an embodiment, the membrane material is silicon nitride. In another embodiment, the membrane material is LPCVD silicon nitride. In an embodiment, the shadow mask defines apertures having at least one dimension of 2.8 µm to 14 µm, including all values to 0.1 µm and ranges therebetween. The shadow mask may be made using a method described herein.

In an aspect, the present disclosure provides systems for forming patterned structures of color emitting materials. The components and combinations thereof that can be used to practice the instant methods are described herein. In various embodiments, the system comprises one or more components described herein.

The following example is presented to illustrate the present disclosure. They are not intended to limiting in any manner.

EXAMPLE 1

In this example, fabrication of a shadow mask, deposition of color emitter materials to form a pattern of color emitter structures, and OLED devices having patterned structures of color emitter structures is described.

Figure 8:
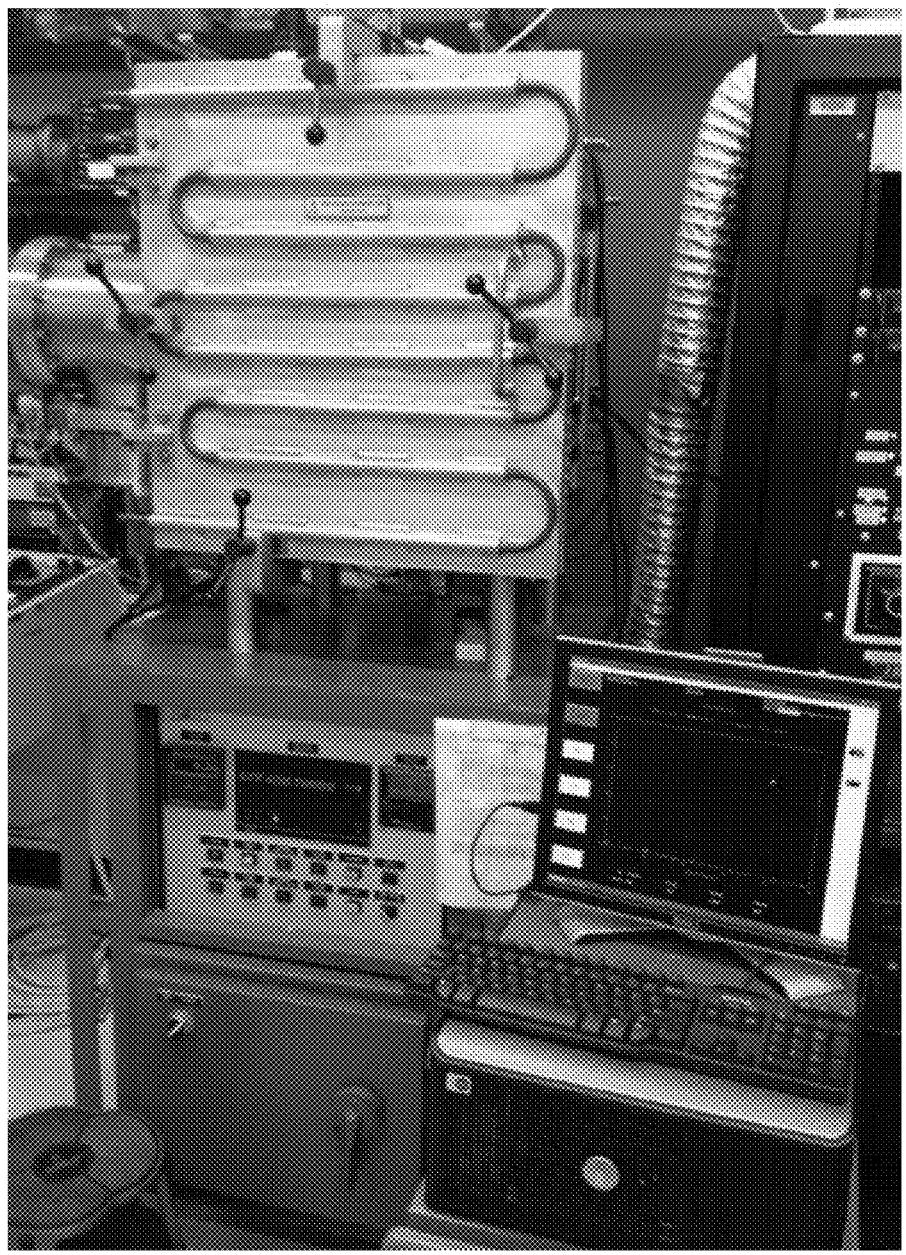
FIG. 8 is an image of a deposition tool with a computer controlled interface.

Deposition Tool. The tool used for deposition is a rectangular chamber that is 20×19×19 inch and uses an Alcatel 5400 turbo molecular vacuum pump that can reach base pressures of about $5 \times 10^{-6}$ Torr. The depositions performed for this work uses pressures of about $10^{-5}$ Torr which gives a mean free path of around 4 m, much greater than the separation of the source to substrate. This allows the depositions to be a function of geometry. In this environment, the organic materials are evaporated or sublimated via resistive heating powered by a Sorensen DCS8-125, where the custom built boats utilizes up to 8 W of power. Deposition rates are determined by quartz crystal monitors that are connected to an "Inficon SQM-242 Thin Film Deposition Controller Card". An image of the deposition system is shown in FIG. 8.

Figure 9:
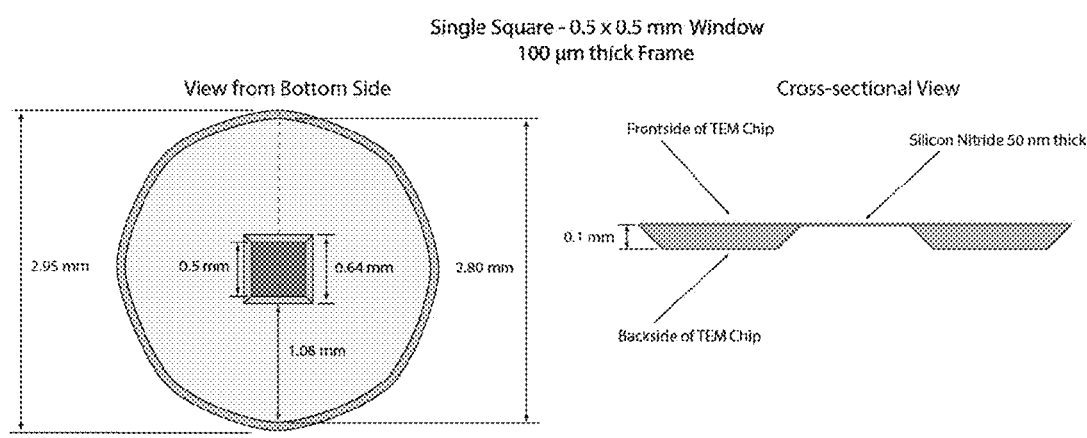
FIG. 9 is a schematic of the SiMPore TEM window used with a porous 50 nm thick free standing silicon nitride film.

To explore the evaporation through SNM, transmission electron microscopy (TEM) windows from SiMPore Inc. were used, specifically "Silicon Nitride 50 nm thick Microporous (Single 500 micron window)". The TEM chip is 3 mm in diameter with a 100 μm thick silicon frame. On the front surface of the TEM window is a free standing 50 nm silicon nitride film that contains 2 μm diameter pores that are patterned using standard photolithography. FIG. 9 shows the schematic of the TEM window used. By using these windows, the patterning characteristics and silicon nitride robustness can be determined. The silicon nitride free standing thin film is 50 nm thick which raise concerns about the fragility and reusability of the SNM, and will be addressed with the preliminary test.

Figure 10:
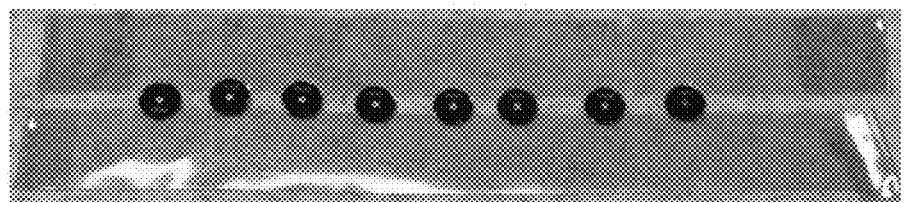
FIG. 10 is an image of 8 TEM windows on kapton tape that are used for the shadow mask test.
Figure 11:
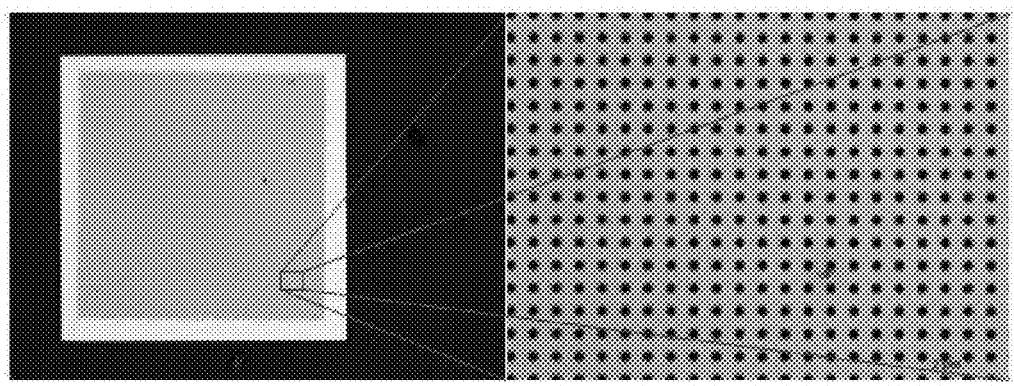
FIG. 11 is an optical micrograph of a TEM window under reflection mode with 100× magnification where the left image is the entire free standing silicon nitride film that contains a large array of patterned holes and the right image is a 1000× magnification that shows the patterned array of 2 μm diameter holes of the same sample.
Figure 12:
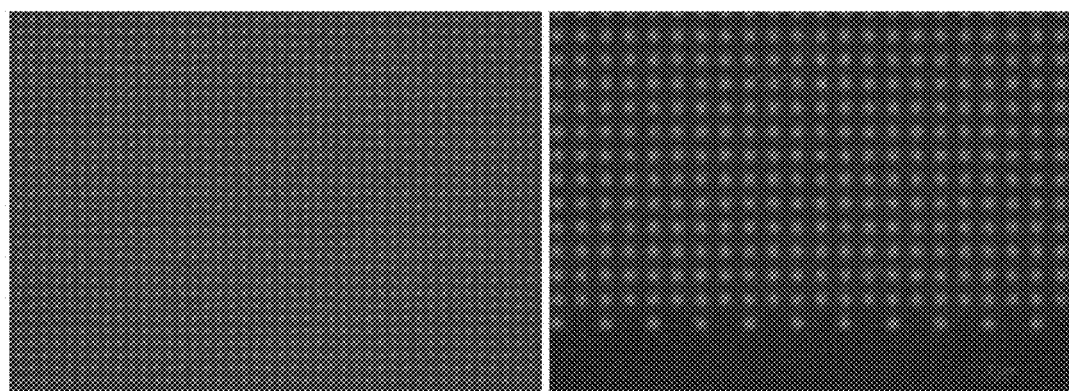
FIG. 12 is a PL image of 40 nm of patterned Alq3 through the use of TEM grids as shadow masks wherein the left image is a magnification of 500×, the right image is a magnification of 1000×, and the diameter of the patterned Alq3 is about 1.9 μm in diameter.
Figure 13:
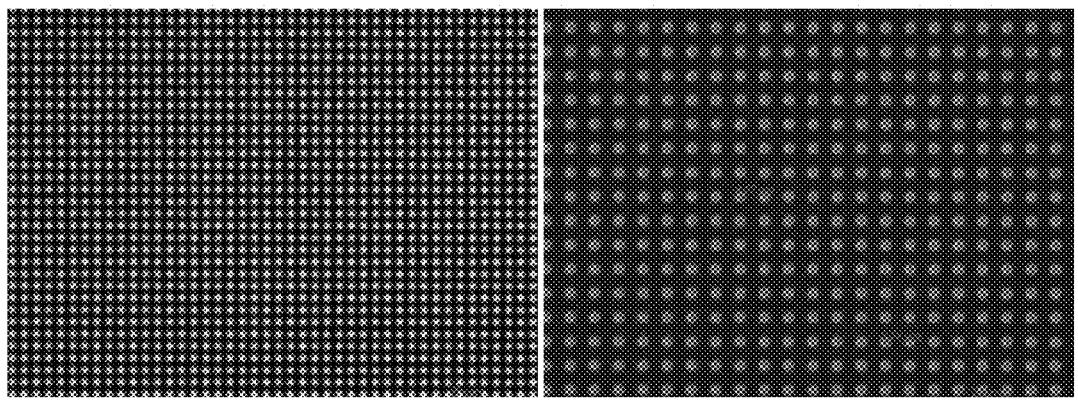
FIG. 13 is an optical micrograph of 400 nm of patterned aluminum through the use of a TEM window as shadow mask wherein the left image is a magnification of 500×, the right image is a magnification of 1000×, and the diameter of the pattern aluminum is about 1.7 μm in diameter.

For this experiment, 8 TEM windows were placed onto kapton tape, shown in FIG. 10, to observe for repeatability and durability of multiple silicon nitride thin films in one deposition run. The TEM windows were then taped onto a glass substrate with the front-side making direct contact with the glass; care was taken to prevent the TEM window from sliding on the glass which could tear the membranes. FIG. 11 shows optical images of the TEM window and the patterned silicon nitride thin film, the black circles are 2 μm diameter apertures in the silicon nitride. The first deposition preformed was an evaporation of 40 nm of Alq3. After evaporation, the TEM windows are removed from the surface of the glass and verification of the Alq3 pattern was obtained through photoluminescence (PL) imaging, shown in FIG. 12. The Alq3 was patterned nearly everywhere expect ones blocked by large debris. The size of the resulting Alq3 pattern, 1.9 μm is comparable with the silicon nitride aperture of 2.0 μm—demonstrating the use of the SNM for organic patterning in the size range of microns. The silicon nitride thin film also survived being in direct contact with the glass repeatedly without breakage. Lastly, the TEM window was also used for patterning aluminum and the results can be seen in FIG. 13, where the patterning appears to be just as effective as organic films.

Figure 14:
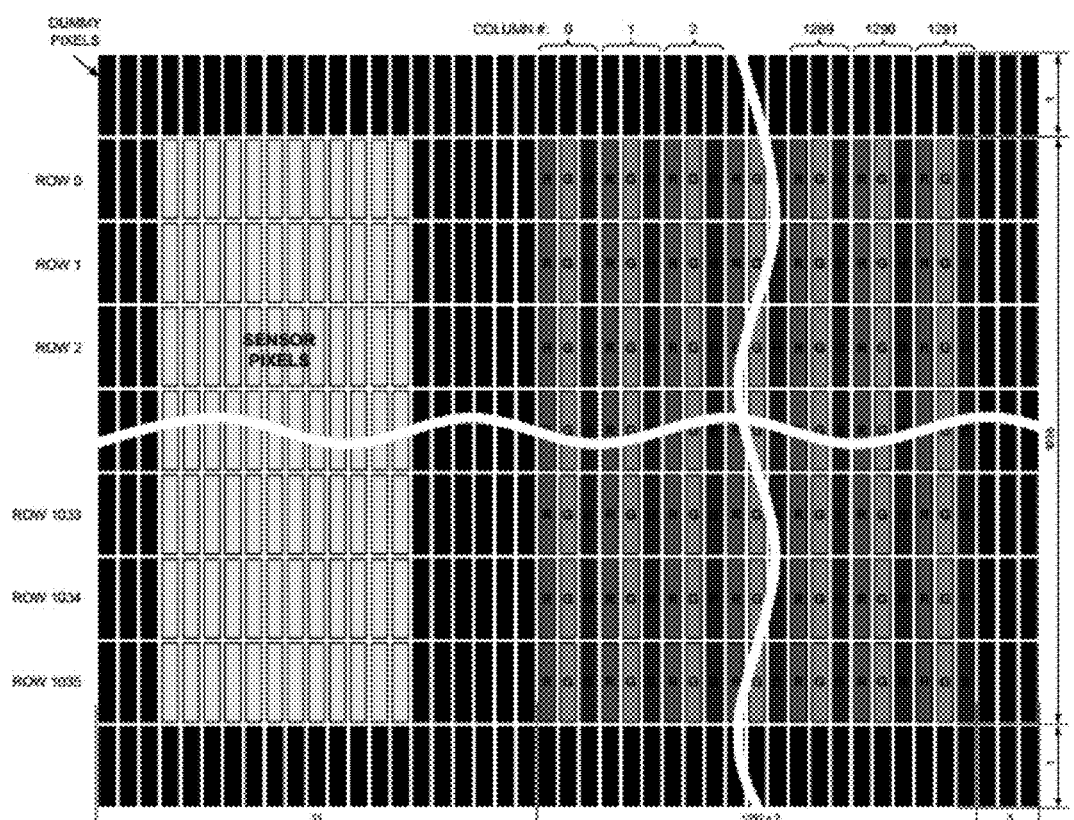
FIG. 14 is eMagin's SXGA display substrate pixel array layout wherein there are 1292×1034 pixels, each pixel consists of three sub-pixels with the colors red, green, and blue, and the color sub-pixels are arranged in columns.

Shadow Mask Design and Results. Shadow Mask Design. An issue not addressed in the preliminary results was the SNM film area where much larger areas are desired than the initial film area used of 0.5×0.5 mm. The main issues that will be investigated for the initial SNM experiment are: aperture geometry, free standing membrane geometry, film type and film thickness. The initial SNM was designed to match the eMagin SXGA substrates.

eMagin SXGA Substrate. The eMagin SXGA display uses single crystal silicon backplane based display substrate that drives current through a white OLED while color is achieved through the use of color filters. The SXGA display has a resolution of 1280×1024 pixels but has an extra 12 column and 12 rows of pixels for alignment and test purposes as shown in FIG. 14 The pixel pitch, the length between two identical features of neighboring pixels, is 12×12 μm and is made up of three sub-pixels that individually are 4×12 μm. The active area of each sub-pixel (anode) is 3×11 μm. With the direct color patterning of the OLED, the organics will need to completely cover the anode of each individual sub-pixel. The active display area for the SXGA substrate is 15.50×12.43 mm or 19.87 mm (0.78") in diagonal.

Aperture Geometry. The aperture geometry was designed to allow patterning of the individual OLED color sub-pixels. Currently, eMagin's SXGA substrate utilizes color filters that run vertically along the display chip with a width of approximately 3.5 μm as shown in FIG. 14.

A static, non-moving shadow mask deposition process was used. The aperture geometry takes into consideration the aforementioned results, where there was approximately a 1:1 transfer of aperture size to deposition size when there is no gap between the substrate and the shadow mask.

Figure 15:
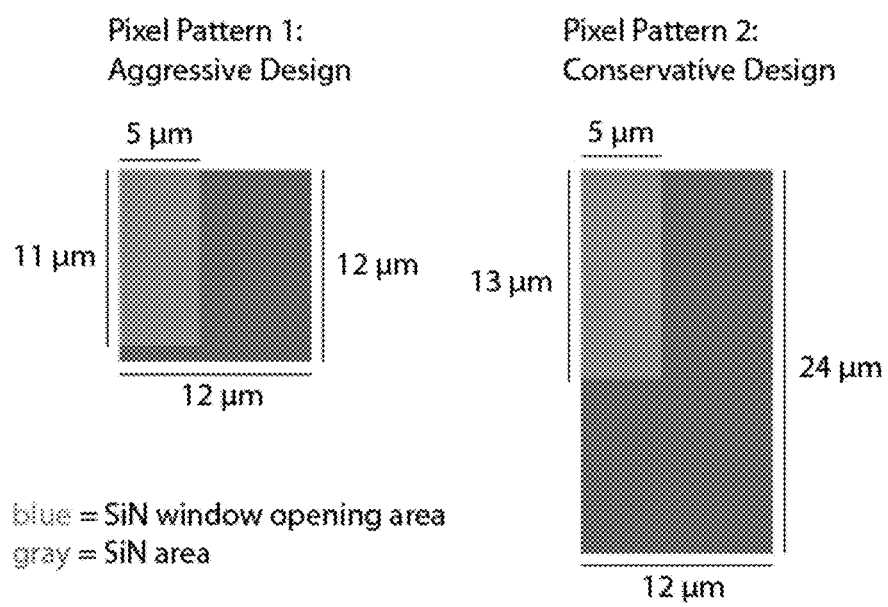
FIG. 15 are unit cells for examples of aggressive and conservative designs wherein the blue color (upper left) denotes the aperture in the SNM and the gray represents the remaining silicon nitride area, the aggressive design has a 5×11 μm aperture in the 12×12 μm unit cell which is also the size of one pixel, and the conservative design has a 5×13 μm aperture in a 12×24 μm unit cell which is the size of two pixels.
Figure 16:
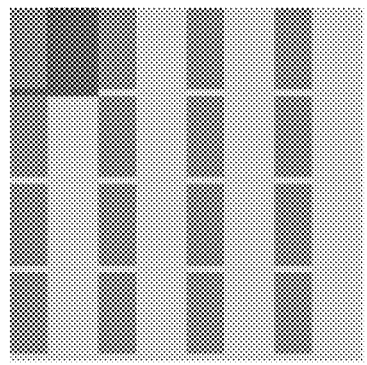
FIG. 16 illustrates a unit cell (dark grey) which has been repeated over a larger area (light grey) to demonstrate the repeating pattern wherein the left sketch shows the aggressive design showing that the 1 μm gaps between the sub-pixels are very narrow for the pattern and could potential hinder structural integrity while the right sketch shows the conservative alternating row design.
Figure 16:
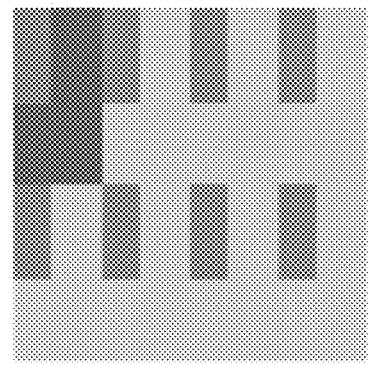

Two types of patterns were used. Pixel Pattern 1. This is an aggressive design meant to completely pattern all the sub-pixels for one color over the free standing area and designs are shown in FIG. 15 and FIG. 16. The unit cell area (the repeating pattern) is 12×12 μm, the size of one pixel. The aperture for the SNM to pattern the sub-pixel is 5×11 μm. The width of the aperture was designed to be larger than the anode to help improve tolerance in x-axis alignment but undesirable color mixing would occur. The rationale was that a working display with mixed colors is the better alternative than a display that is shorted. For the aperture height, an increase to improve the tolerance was not possible since the remaining 1 μm bar between each aperture in the y-direction is needed to provide integrity of the shadow mask. There are concerns that the 1 μm bar might not be enough to provide enough structural integrity for the silicon nitride film and to address this, pixel pattern 2 was generated. A thicker bar was not used due to the fact that the anodes are 11 μm and 1:1 transfer was expected so y-axis alignment for this pattern has no tolerance. If there was a gap between the shadow mask and substrate, the deposition could expand and provide more tolerance for this pattern design with the SXGA substrate.

Pixel Pattern 2. A conservative design approach was used to strengthen the mask where the sub-pixels will be patterned in alternating rows over the free standing area and the design is shown in FIG. 15 and FIG. 16. This design will require two depositions to completely cover one color in the shadow mask area, where one deposition will need to be shifted down or up to complete the color. The unit cell area (the repeating pattern) is 12×24 μm, the size of two pixels. For this design, the width and height of the aperture was oversized by 2 μm to a new aperture dimension of 5×13 μm to help improve tolerance with the alignment.

Figure 17:
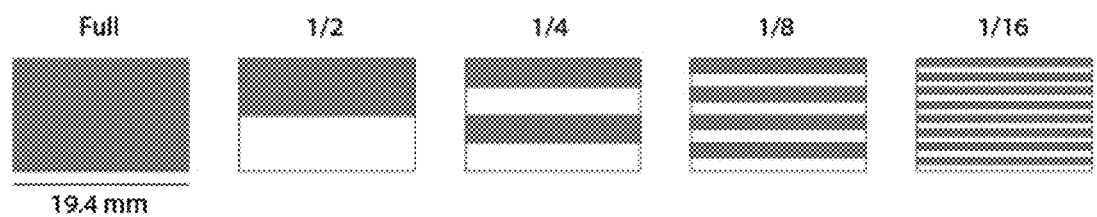
FIG. 17 is an example of SNM geometry design where the height is split by powers of 2 to reduce the SNM area and improve robustness wherein the SNM are staggered in such a way that shifting it in along the height once will provide complete coverage of the full design as long as the pattern repeats in the height dimension and the blue is the SNM while the border denotes the size of the full SNM.

SNM Geometry. Ideally, the SNM should span the entire SXGA microdisplay (15.50×12.43 mm) and allow for patterning over the entire display area for one color if pixel pattern 1 is used. However, there are concerns that such a large SNM might have issues with integrity, sagging and distortion. One method to overcome the issues of a large SNM is to divide the SNM into fractions of the full design and perform a step and deposit technique to cover the full design area so long as the pattern is repeated within the smaller SNM. Otherwise, a new SNM with the other pattern will need to be used for the subsequent deposition. If dividing the membrane needs to be done, divide it in one dimension would be ideal and so that only two depositions are needed to replicate the patterning of a full shadow mask. In this situation, there is an advantage to a SNM with the largest amount of divisions which will increase the robustness and reliability of the SNM. FIG. 17 shows the design plan for smaller SNM geometries with reductions along the height.

Film Type. Free standing membranes that are a few millimeters in area for thicknesses of under a micron has currently only been reported for films made with low pressure chemical vapor deposition (LPCVD) deposited silicon nitride and is currently being offered as products by companies such as "TEM Windows" and "Aquamarijn". An advantage of LPCVD silicon nitride is that the tensile stress is tunable since too much tensile stress can cause the free standing thin film to shatter and too little tensile stress can cause the free standing thin film to sag. For a shadow mask, low tensile stress of around 250 MPa may be ideal to allow for a taut membrane that will not shatter. In addition, LPCVD silicon nitride has other benefits such as achieving a high quality film with minimal defects over an entire wafer and throughout the lot of wafers. Silicon nitride also has desirable chemical properties, for examples being resistant to most solvents, acids and bases. Thermally, silicon nitride can handle much greater temperatures than the organic evaporation which operates at around 300° C. at the source; therefore, the SNM can be easily cleaned thermally.

Film Thickness. The strength of a free standing film is proportional to the film thickness. LPCVD silicon nitride can be deposited from 50 Å to 2 μm thick. A consideration that may influence film thickness is aspect ratio between the film thickness and aperture geometry since deposition material will build up on the sidewalls of the shadow mask and result in a reduction in the aperture size. This becomes significantly more important as the ratio between film thickness and aperture opening increases.

Figure 18:
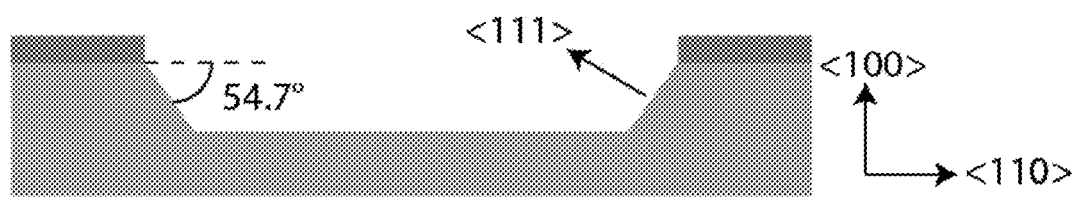
FIG. 18 is an example of a KOH anisotropic wet etch of a silicon wafer that preferentially etches the <100> direction 200 times greater than the <111> direction wherein the blue (top layer) is the etch mask and the gray is the silicon wafer.

Anisotropic Etch of Silicon. A major design consideration for the SNM is the anisotropic etch of the silicon substrate that will support the SNM. This will determine the backside mask pattern and will greatly affect the SNM geometry, especially if small slots are to be formed. The etch chemistry used was potassium hydroxide (KOH) which etches the silicon wafer along the <100> crystal plane 200 time more than the <111> plane as shown in FIG. 18. The design of the backside mask pattern will need to take the sloped sidewalls into consideration for accurate membrane geometries. For a through wafer etch of a 315 μm thick wafer, an additional 446 μm needs to be added to the mask design to form the targeted membrane geometry.

Figure 19:
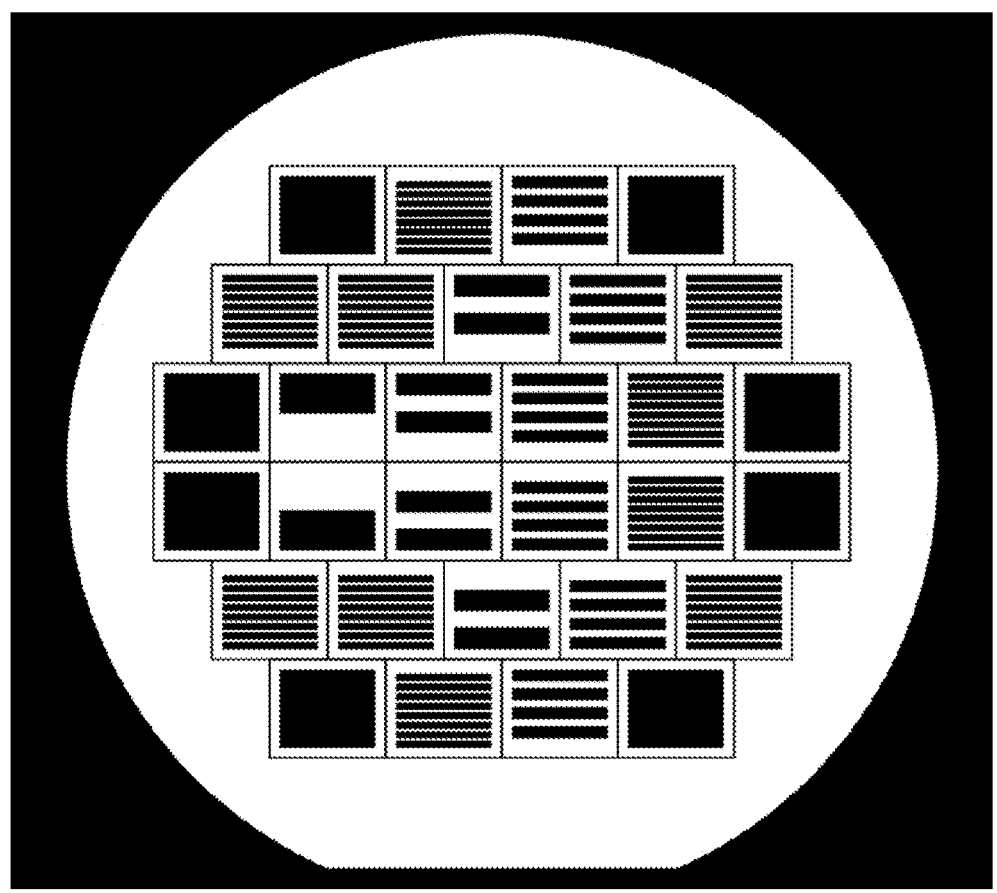
FIG. 19 is an example of a backside mask pattern of the SNM.

Backside Mask Design. The two wafers to be fabricated will both have the same backside mask design that will contain a variety of SNM geometries as described in FIG. 19. This will range from the full membrane to 1/16 of the full SNM size along the height. There may be a preference for making more of the full membrane and the 1/16 size because these would be the most desirable for shadow mask usage. FIG. 19 shows the variety of membrane geometries distributed across the 6" wafer. The backside mask pattern was also designed to be cleaved into individual SNM with a silicon frame for support.

Figure 20:
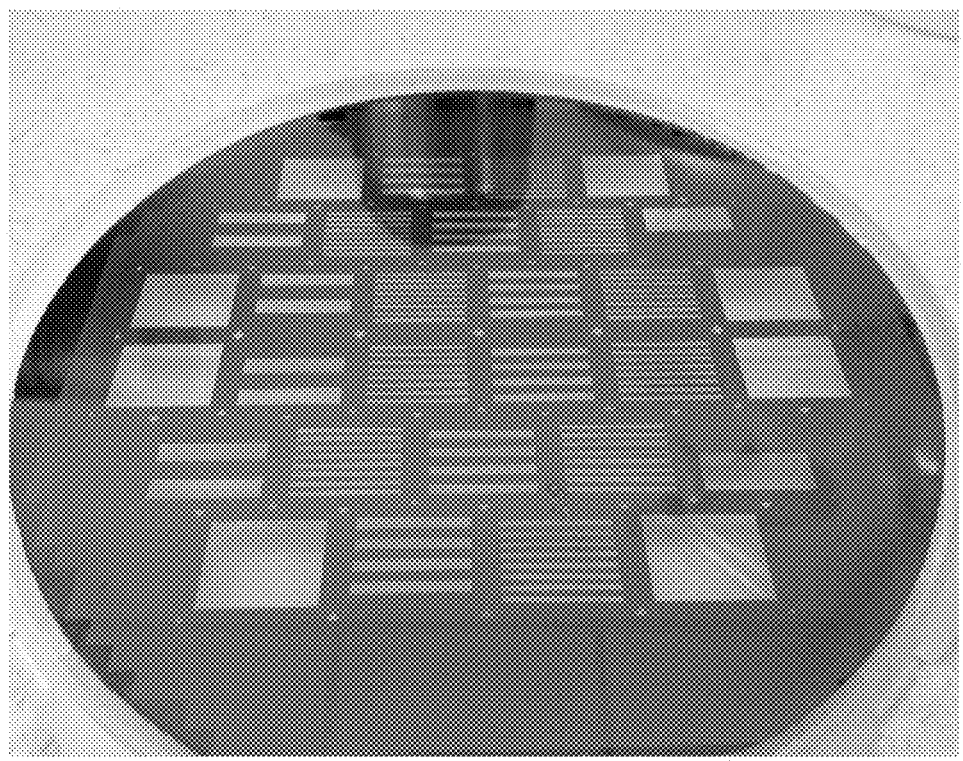
FIG. 20 is an image of a fabricated 6 inch wafer wherein the SNM has the SXGA design with pixel pattern 2.
Figure 21:
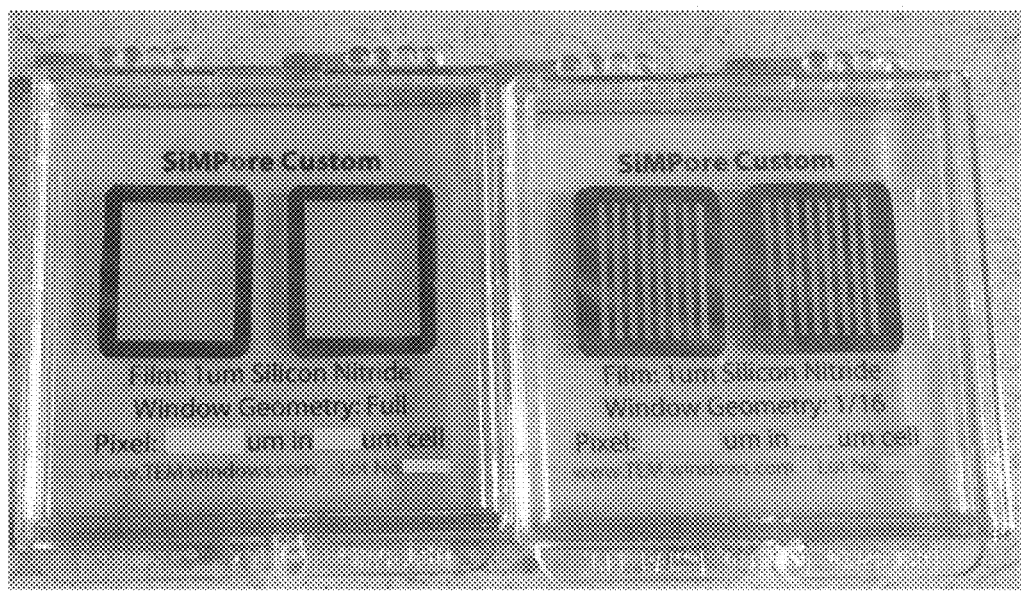
FIG. 21 is an image of individual SNMs wherein the left box contains the full size SNMs and the right box contains the 1/16 SNMs.

Initial Shadow Mask Fabrication Results. With the aforementioned design considerations, initial experiments were based on two 6 in diameter, 315 μm thick double-side polished silicon wafers. One wafer was processed with the aggressive design (Pixel Pattern 1) and the other wafer using the conservative design (Pixel Pattern 2). The 315 μm thick wafers were used because these were the thinnest 6 in wafers that can be used by the fabrication tools—where a thinner wafer will allow for faster through wafer etch, a time consuming process step. The double sided polish facilitates patterning on both sides of the silicon wafer. A set of wafers were deposited with 1 μm thick LPCVD silicon nitride since it should provide strength while remaining smaller than the smallest aperture opening feature of 5 μm. There is the ability to etch back some of the silicon nitride if thinner silicon nitride is desired. The entire fabrication process of the silicon nitride is described in this example where FIG. 20 shows a fully fabricated 6 inch wafer with the array of SNM and FIG. 21 shows individual SNM from the wafer in FIG. 20.

Shadow Mask Robustness. After the fabrication of the two wafers, the SNM were observed for integrity, specifically the survival of the SNM after fabrication. The SNM breakage rate (MBR), the number of broken SNM divided by the number of manufactured SNM, was determined for each pixel pattern and aperture geometry.

Figure 22:
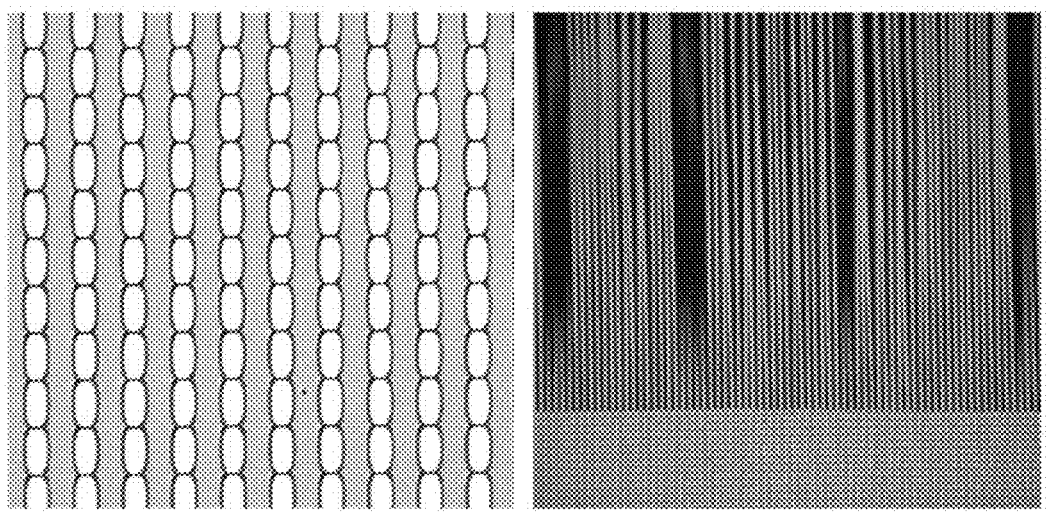
FIG. 22 is an optical micrograph of an example of pixel pattern 1 wherein the left image is after dry etch of the silicon nitride, the right image is the silicon nitride membrane spanning the silicon frame after shadow mask fabrication, and the over etch of the silicon nitride caused merging of the openings, resulting in lines of silicon nitride that are flexible and, thus, a loss of shadow mask integrity.
Figure 23:
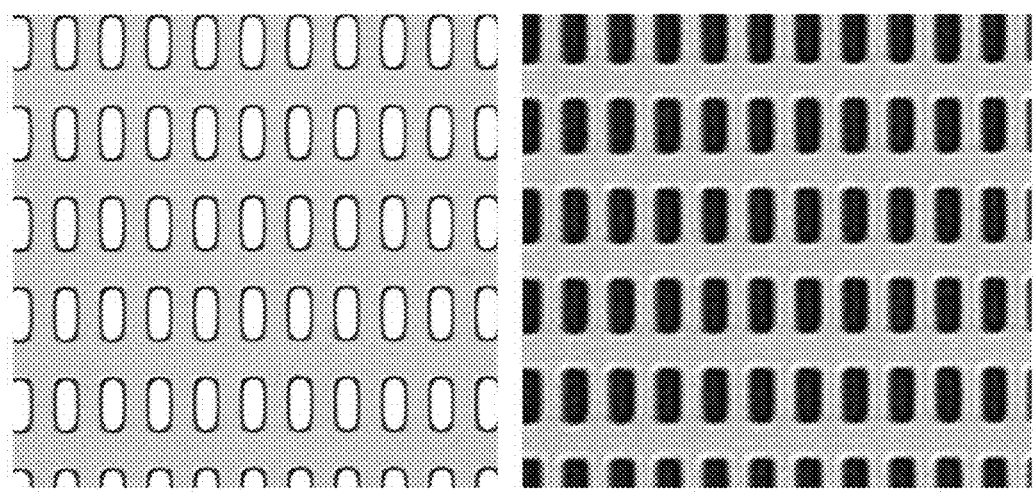
FIG. 23 is an optical micrograph of an example of pixel pattern 2 wherein the left image is after dry etch of the silicon nitride and the right image is the silicon nitride membrane after shadow mask fabrication.

Table 2 shows the MBR of the different pixel patterns and aperture geometry where breakage of SNM only occurred for pixel pattern 1 while the SNM with pixel pattern 2 are all completely intact. The SNM breakage in pixel pattern 1 was caused by the degradation of the 1 μm bar due to an over-etch that separates the top and bottom apertures. The merging of the apertures has resulted in lines of silicon nitride that are very flexible which can then flex into neighboring silicon nitride lines and stick together, resulting in a loss of SNM integrity. FIG. 22 shows images of pixel pattern 1 after dry etch of the silicon nitride and after complete fabrication. From the dry etch, significant over etching can be seen, resulting in an increase of about 1 μm in each direction. Steps can be taken to reduce the amount of over etching or a smaller design can be used to compensate for the over etch. Pixel pattern 1 may work if the 1 μm bars remained intact, but this would require fabrication and design improvements. Pixel pattern 2 has the same amount of over etch as pixel pattern 1 but because of the alternating rows of sub-pixel patterning, it didn't suffer from the merging apertures, allowing for intact SNM to be fabricated. The resulting aperture size of pixel pattern 2 is 6.3×14.1 μm. FIG. 23 shows images pixel pattern 2 after the dry etched silicon nitride and the resulting intact SNM.

TABLE 2

Membrane breakage rate of the SNM with different pixel pattern and aperture geometry.

| Pixel Pattern | Pixel (μm) | Unit Cell (μm) | Full Mask MBR | 1/2 Mask MBR | 1/4 Mask MBR | 1/8 Mask MBR | 1/16 Mask MBR |
|---|---|---|---|---|---|---|---|
| #1 | 5 × 11 | 12 × 12 | 100% | 100% | 100% | 100% | 40% |
| #2 | 5 × 13 | 12 × 24 | 0% | 0% | 0% | 0% | 0% |

SNM Flatness. Flatness of the full size silicon nitride membranes with pixel pattern 2 was measured and membranes had less than 1 μm in sagging from the center of the membrane to the silicon frame. This measurement agrees with the low tensile stress of the silicon nitride. Another observation that points toward the low tensile stress of the silicon nitride is that when these membranes do break, they tend to shatter from the stress.

Figure 24:
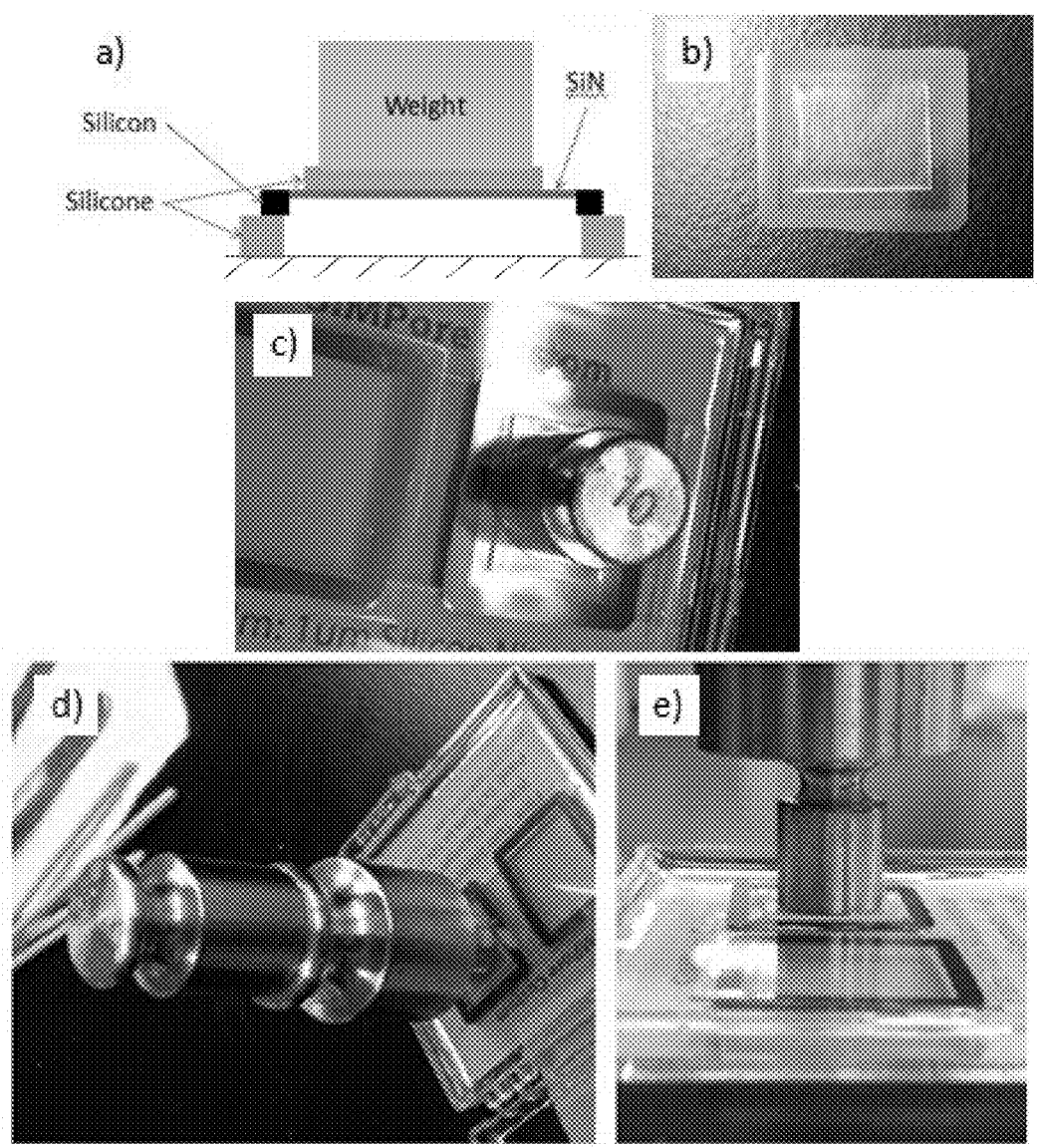
FIG. 24 illustrates a strength test of an example of a full SNM with pixel pattern 2 wherein a) cross-sectional diagram of the weight test where the SNM sits on a silicone trench 3 mm deep to prevent the membrane from sagging and touching the support surface when a 0.3 mm thick silicone sheet sits inside the silicon nitride to soften the contact between the weight and the silicon nitride to prevent puncturing of the membrane, b) top down view of the full SNM with the silicone sheet inside the silicon nitride membrane area, c) a 10 g weight that sits completely inside the silicon nitride area, d) 160 g (50 g on top of 100 g on top of the 10 g) of weight on the silicon nitride membrane, and e) side view of the 160 g total weight showing the membrane stretching slightly.

SNM Strength. The SNM was found to be strong in a simple test that involves placing standard weights onto the SNM and observing the maximum weight that the SNM can hold. These tests were performed on the full SNM with pixel pattern 2 that has an effective porosity of about 25%. The SNM was placed on a raised support to allow for the silicon nitride to potentially flex past the supporting silicon. A piece of 0.3 mm thick silicone was placed within the free standing silicon nitride to prevent sharp points on the weight or sharp debris from being pressed into the free standing silicon nitride and causing premature breakage. A 10 g weight ended up being the only weight to make contact with the silicone since its diameter was small enough to fit within the silicone but large enough to balance weights above it. Ultimately, a total of 180 g of weight was placed on the SNM before it finally broke during the removal of the weight. The silicon nitride membrane did deflect during this test but not more than 0.3 mm, the thickness of the silicon support, see FIG. 24.

Figure 25:
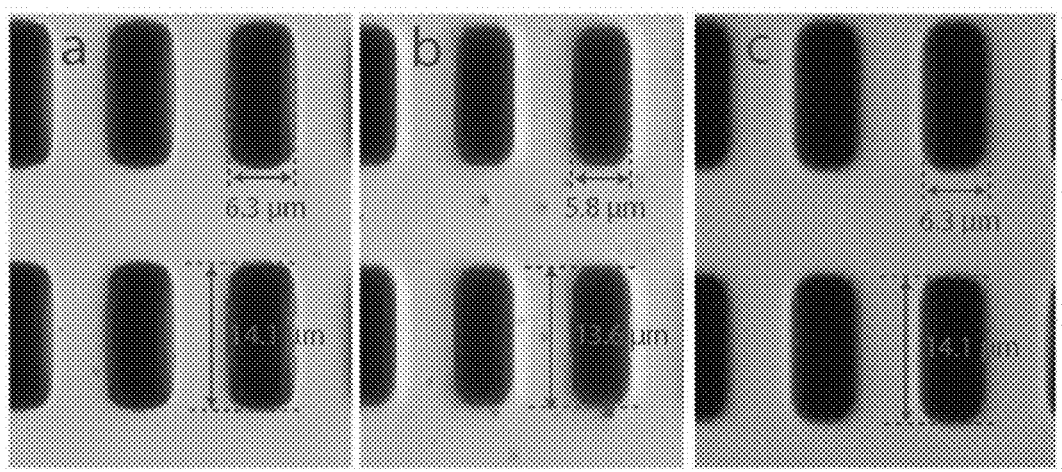
FIG. 25 are optical micrographs of examples of clogging and cleaning of the SNM of pixel pattern 2 wherein a) shows a new SNM with an aperture of 6.3×14.1 μm, b) shows a used SNM with 5 μm of Alq3 depositions and a new aperture width of 5.8×13.6 μm, and c) acetone rinse of the used silicon nitride membrane showing complete recovery of the aperture size.
Figure 26:
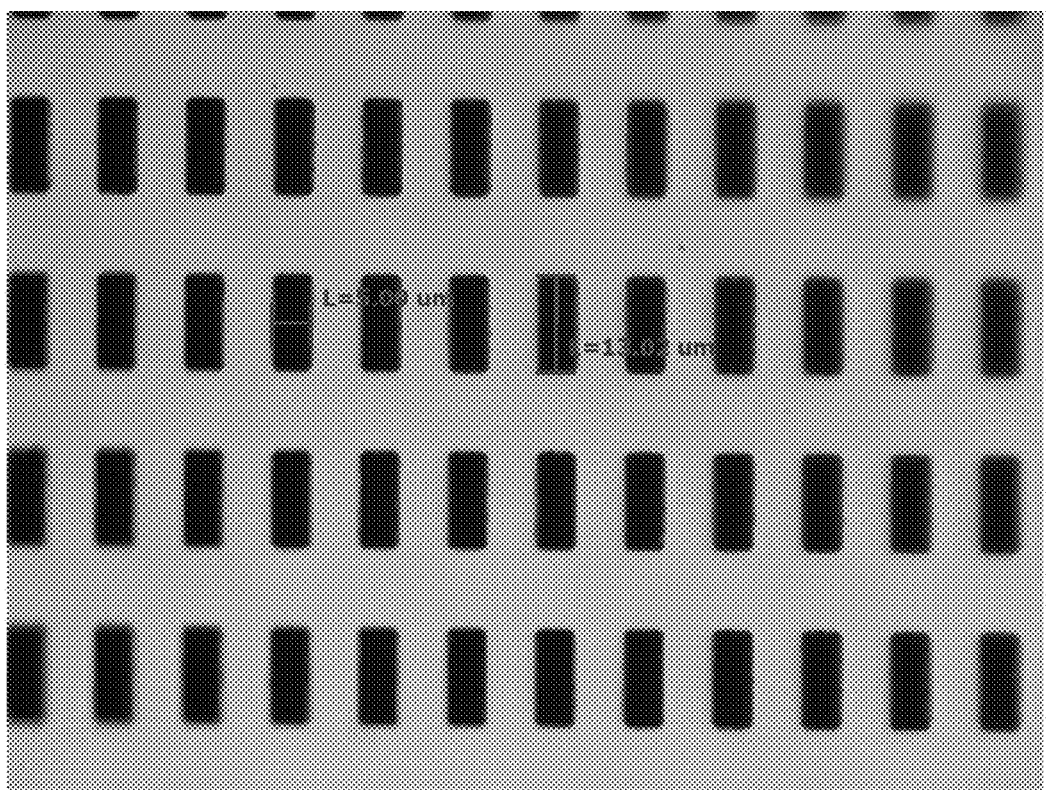
FIG. 26 is an optical micrograph of a silicon nitride mask with pixel pattern 2 showing no over etch with apertures of 5.0×13.0 μm.
Figure 27:
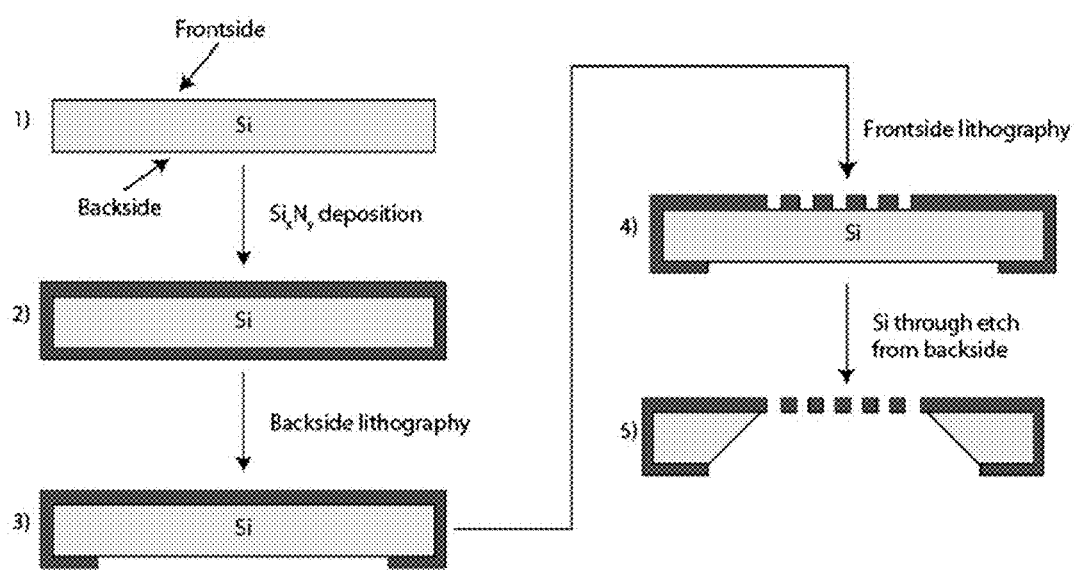
FIG. 27 is a diagram of an example of major fabrication steps for the SNM including 1) initial substrate, 2) silicon nitride deposition, 3) backside lithography to define free standing geometry, 4) front-side lithography to define SNM features, and 5) silicon through wafer etch from the back-side to free the silicon nitride.

SNM Cleaning. As the SNM is used, the SNM can build up material on the surface and along the edges of the silicon nitride, resulting in an increase in silicon nitride thickness along with a decrease in the aperture opening. This increase in thickness and decrease in aperture opening will affect the resulting pattern from the SNM. Depending on the requirements of the patterning features, the amount of material deposited, and the type of material deposited, the shadow mask can either be used for multiple runs or only once. The ability to clean and reuse the SNM is important to decrease cost of manufacturing. Since the SNM is very resistant to many acids, bases and solvents along with handling temperatures of greater than 1000° C., there are many options to clean the SNM. For this work on OLED pattern, the SNM are only used for organic depositions, so cleaning is fairly straight forward where there is the option of either heating the SNM past the evaporation or sublimation temperature of the organic (300-400° C.) or the other option is to dissolve the accumulated organic materials on the SNM with solvents. FIG. 25 shows images of a new SNM with the pixel pattern 2 with an aperture size of 6.3×14.1 μm and then a subsequent reduction in the aperture size after a deposition of 5 μm of Alq3 which reduced the aperture by 0.5 μm in each direction. Afterwards, the Alq3 was successfully removed with acetone and the aperture returned to the original size.

SNM Over-etch Improvements. After the initial fabrication, the SNM fabrication process was improved to achieve the targeted design size of the SNM apertures. One process improvement to reduce the oversized aperture was to change the lithography of the front-side pattern from a g-line stepper to an i-line stepper where the decrease in wavelength used from 436 nm to 365 nm helped improve pattern transfer from the photomask to the resist. Another improvement was the usage of an aluminum hard mask as oppose to just using a photoresist mask. Lastly, a reduction of the design size in the photomask by 0.75 μm in each direction to account for some isotropic etching enabled the production of targeted SNM aperture sizes.

Silicon nitride shadow masks were successfully fabricated for a 1 μm thick silicon nitride that spans an area of about 16×13 mm and contains pixel pattern 2 but not pixel pattern 1. The lines in pixel pattern 1 made of silicon nitride were too weak to be used as a SNM. Pixel pattern 1 may be fabricated if over-etching was prevented or pattern compensation is employed. Instead of having the same color pixels stacked above one another, if they were instead staggered in such a way that doesn't require thin silicon nitride regions which are prone to failure, a single deposition for each color can be achieved instead of two depositions for each color using pixel pattern 2. Larger geometries of SNM are also possible since the largest SNM for pixel pattern 2 were all completely intact while also exhibited high strength, holding up 180 g of weight.

Cleaning of the SNM was a fairly easy process. Removal of organics with acetone showed no detrimental effects on the SNM. From a production standpoint, cleaning the SNM by using a dry method such as heating or dry etching of the SNM to remove the organics might be more ideal.

Over etching of the SNM apertures was significantly reduced with process improvements resulting in apertures being nearly identical to the targeted design size. This is a significant improvement from the 1 μm over-etch in the aperture. Since pixel pattern 2 was suitable for the purpose of demonstrating the feasibility of SNM for high-resolution OLED microdisplay patterning, redoing pixel pattern 1 without the over etch was not attempted.

Fabrication Process of Shadow Mask. FIG. 25 provides a visual representation of the major processing steps.

Substrate. The substrates used for the initial SNM design was a silicon wafer (Silicon Quest International, San Jose, Calif.) that was 150 mm in diameter, <100>, 300 μm thick, double-side polished wafer, low resistivity (<5 ohm-cm) and n-type. For the initial experiments, the 150 mm diameter wafers are suitable since it will be cleaved into individual SNM to be used with individual display chips. For production scale SNM, it is desirable that the wafer size be identical or larger than the wafer with the display substrates where shadow masking will occur throughout the entire wafer. A crystal orientation of <100> is important for the aforementioned through wafer etch process during the discussion on anisotropic etch. The thickness of wafer used for this initial experiment was chosen to be as thin as possible for the 150 mm substrate to reduce the through wafer etch process time, a fairly substantial and long process. The ultimate thickness of 315 μm was used because it is the minimal wafer thickness that the tools used. Double-side polished wafer is an important criterion for the shadow mask where both sides of the wafer will require thin film depositions and subsequent photolithography to define both the pixel openings and through wafer etch features. Resistivity (<5 ohm-cm) and dopant type (n-type) may not be of significant importance to the fabrication of the shadow masks.

Initial Cleaning. The wafer was first put through a standard RCA clean to remove any debris and contaminates during packaging, shipping and handling of the substrates. The RCA clean consists of multiple baths where the first bath (SC-1) was a heated (75° C.) mixture of de-ionized (DI) water ($H_2O$), hydrogen peroxide ($H_2O_2$, 30% wt) and ammonium hydroxide (NH4OH, 25% NH3) at a ratio of 15:3:1 respectively. The SC-1 bath oxidizes organics and Group IB and IIB metals as well as other metals. The SC-1 bath also slowly etches the thin native oxide layer on the Si surface and forms a new layer of oxide of Si surface. This constant growth and etch of the native oxide helps removes particles. The wafers are placed into the SC-1 bath for 10 minutes and then followed by a DI water cascade rinse for 5 minutes. The chemical oxide on the wafer was then removed by placing the wafer into a 50:1 hydrofluoric acid (HF) bath for one minute. The HF bath also helps desorb metallic impurities from the silicon surface. The wafer was again rinsed in a DI water cascade rinse for 5 minutes. An SC-2 bath follows and it consists of a (75° C.) mixture of de-ionized (DI) water ($H_2O$), hydrogen peroxide ($H_2O_2$, 30% wt) and hydrochloric acid (HCl, 37% wt) at a ratio of 15:3:1 respectively. The SC-2 bath dissolves and remove surface alkali residues and any residual trace metals as well as metal hydroxides. SC-2 bath was for 10 minutes and then followed by a DI water cascade rinse for 5 minutes. Immediately following the DI water cascade rinse, the wafers are placed into a spin rinse dry.

Silicon Nitride Deposition. Following the RCA clean, wafers will receive a thin film deposition of silicon nitride. This silicon nitride layer will serve as the resulting shadow mask on the front-side of the wafer and in addition, will serve as the backside mask that will define the free standing membrane geometry. A important feature of the silicon nitride is a defect free film that will translate to a defect free SNM. Lastly, it is important to control the film stress where too much tensile stress can cause the SNM to buckle or the SNM to shatter; on the other hand, too little stress (e.g., <100 mPa) and the membrane will sag resulting in a poor quality SNM. Film stress can also be controlled by deposition parameters, tuning the silicon nitride stoichiometry or incorporating other elements.

The silicon nitride was deposited by a LPCVD process which deposited a conformal silicon nitride film throughout the entire wafer. The deposition was 1.0 μm+/−0.5% with a film stress of 250 mPa (tensile). Film thicknesses and uniformity was checked with an ellipsometer (Woollam VASE).

Patterning. After the thin film deposition of the silicon nitride, both sides of the wafer received patterning of the silicon nitride film, the front-side to define the shadow mask opening and the backside to define the free standing membrane. See steps 3 and 4 from FIG. 25. The photolithography processes for each side of the wafer are done separately starting from the backside. For the initial silicon nitride shadow mask device, the backside pattern design only has feature with sizes in the millimeter range allowing for a contact lithography process. Mylar mask was used to produce the backside pattern, a cheaper alternative than chrome masks. The tool used for the backside contact patterning was the Karl Suss MA150 Contact Aligner. For the front-side patterning, the features sizes desired are in the order of microns, feature sizes at the edge of contact lithography's ability to resolve. Another challenge of using contact lithography is that for the front side pattern the density of the features is high since mask-making vendors charge based on write-time and would make mask fabrication costly. The use of a stepper may alleviate these issues by only requiring a small field of the repeating pattern instead of a whole mask full of the pattern. In addition the stepper used, ASML PAS 5500/200 i-line 5× stepper, uses masks with features 5× greater than the patterned features thereby placing less of a burden on the photomask. Lastly, the ASML stepper is capable of using a single photomask that has been divided into four quadrants to utilize 4 different patterns on one mask.

Figure 28:
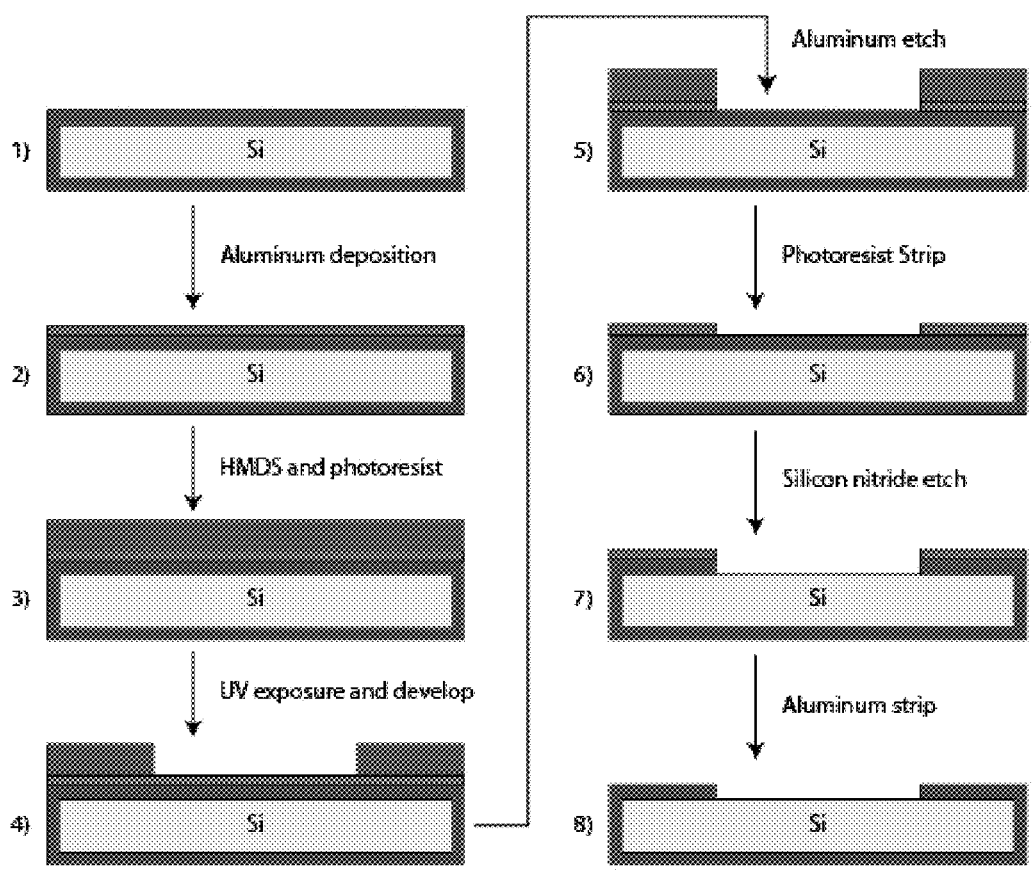
FIG. 28 is a diagram of an example of a patterning process for 1 μm thick silicon nitride film.

FIG. 28 shows the process flow for patterning the 1 μm thick silicon nitride film and is described as follows:

1) Due to the thickness of the silicon nitride, a typical 1.5 μm thick photoresist (OIR 620 i-line) was unable to withstand the entire dry etch of the 1 μm thick silicon nitride film. Instead, an aluminum hard mask was used. The first step subsequently after an RCA clean was to deposit approximately 100 nm of aluminum on top of the silicon nitride through a sputtering process using the Perkin-Elmer 4400 PC sputtering tool.

2) Once the Aluminum hard mask layer was deposited, the photolithography process can then take place. First, a layer of hexamethyldisilazane (HMDS, photoresist adhesion promoter) was spun onto the wafer and baked at 150° C. for 1 min. Subsequently, a 1.5 μm thick layer of i-line positive photoresist (OIR-620) was applied and was baked at 150° C. for 1 min.

3) Photoresist was then exposed by UV excitation at a dose of 150 mJ/cm$^2$ through a photomask to transfer the pattern from the photomask to the photoresist. For the backside pattern, the Karl Suss MA150 Contact Aligner was used in conjunction with the backside Mylar mask. For the front-side pattern, the ASML PAS 5500/200 i-line 5× stepper was used in conjunction with the front-side chrome mask.

4) After exposure, a post exposure bake was done at 105° C. for 1 min and was then developed. A resist developer (Microposit MF-321 Developer) was then used to dissolve the UV exposed photoresist and the typical time to develop was around 5 min. Inspection of the patterned photoresist was typically done at this point to verify the successful pattern transfer from photomask to photoresist. If defects are found at this point, the photoresist was easily removed with a solvent strip bath (Baker PRS-2000 Resist Stripper @ 90° C. for 10 minutes).

5) Subsequently the aluminum was patterned using Fuji 16:1:1:2 Aluminum Etch for 5 min for 100 nm thick aluminum. An over etch of 10% was performed to ensure complete pattern transfer from photoresist to aluminum. Pattern transfer can be verified at this point. If defects are found, the patterned aluminum can be etched away through the use of the Fuji 16:1:1:2 Aluminum Etch after the photoresist was removed. After aluminum etch, the wafer was then cleaned of the remaining silicon dust and debris from the aluminum etch through the use of a freckle etch (65-75% phosphoric acid ($H_3PO_4$), 5-15% acetic acid ($C_2H_4O_2$), 1-5% nitric acid ($HNO_3$), 1-5% fluoroboric acid ($H_3OBF_4$) and DI water remainder to 100%.

6) The photoresist doesn't have to be removed before dry etching of the silicon nitride but for consistency, the resist was removed in the solvent strip bath (Baker PRS-2000 Resist Stripper @ 90° C. for 10 min).

7) After the photoresist removal, the silicon nitride can now be etched using the Drytek 482 Quad Etcher with the following conditions: 100 SF6:100 Ar @ 250 W for 10 min @ ~40° C. An over etch of 20% was performed to ensure complete pattern transfer from aluminum to silicon nitride.

8) The remaining aluminum can be removed in the Aluminum etch tank mentioned in step 5 followed by freckle etch and SC2 clean to complete the lithography process.

Wafer Through Etch. Before etching through the silicon wafer to free the silicon nitride thin film, the front-side silicon nitride was covered in a protective coating to prevent etching of the silicon through the silicon nitride openings on the front-side of the wafer. This is to ensure a controlled single sided etch process. Before the protective coating was applied, a planarization layer was deposited to assist in the protective coating application which prevents voids and defects from forming. The planarization layer used was 1 μm of PECVD (Tetraethyl orthosilicate, TEOS) silicon oxide. The protective coating used was 3 μm of ProTEK® B3, a spin coated polymer that protects against etching from alkaline solutions. To perform the wafer through etch; a 77° C. bath of 20% potassium hydroxide (KOH) was used. KOH typically etches silicon at 1 μm per min, therefore, a 315 μm wafer will take approximately 5 hours. Following wafer through etch, the wafer was rinsed in DI water cascade rinse for 10 min. Following the rinse, the ProTEK® B3 was removed with a piranha etch, a 10:1 mixture of sulfuric acid ($H_2SO_4$) and hydrogen peroxide ($H_2O_2$) heated to 120° C. for 10 min. A DI rinse for 10 min follows and then the TEOS silicon oxide was removed with 10:1 BOE (buffered oxide etch) for 5 min and was then followed by another DI rinse for 10 min. Subsequently, the wafer was submerged in isopropanol (IPA) and pulled out slowly so that it's dry as it leaves the solution to prevent drying marks and debris.

Figure 29:
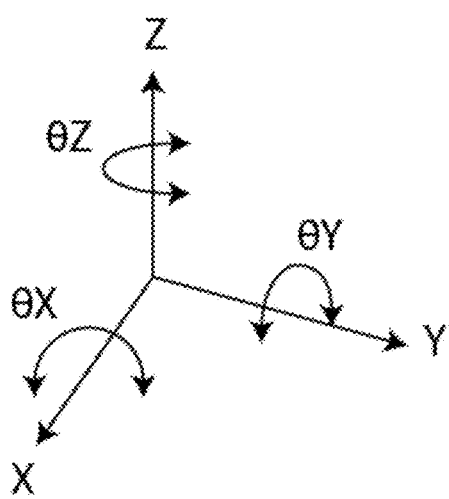
FIG. 29 is a 6 axis diagram showing X, Y, Z, θX, θY and θZ.

Alignment System. The alignment system may be a critical component which enables the alignment of the shadow mask to the display substrate. The alignment of two planes, the SNM and display substrate surface, requires the control of 6-axis: X, Y, Z, θX, θY, and θZ (see FIG. 29) for either the SNM or display substrate. In addition, the alignment system requires minimum increments in the sub-micron range to align features with sizes of around 3 microns. Along with the motion control, optical registration with a microscope was used. Lastly, vibration control was detailed which was important for accurate alignment between SNM and substrate.

Figure 30:
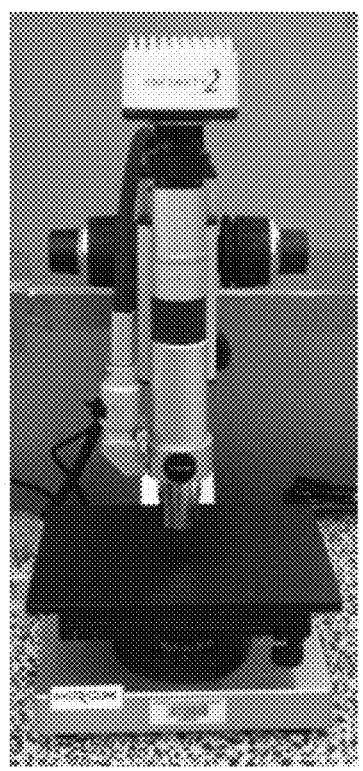
FIG. 30 illustrates a Hirox digital microscope with Infinity 2 camera and 700× objective microscope lens.

Optical Registration and Vibration Control. Alignment between the display substrate and SNM was performed with a microscope. Rev. 1 alignment stage, required a microscope to view the system from below. The microscope used was a digital microscope from Hirox, which allows for much greater flexibility on microscope placement due to digital imaging, see FIG. 30. The microscope objective used was a 700× lens and the body of the microscope can perform an additional magnification from 1× to 10×.

Since the SNM is transparent and porous, the SNM will always be positioned closer to the microscope than the display. From this position, the silicon nitride plane can be determined with respect to the display substrate. Positioning from at least two points was used to determine the alignment for X, Y, and θZ. In addition, the microscope can be used to determine the spacing between the SNM and substrate by observing focusing on each surface and observing the micrometer height knob difference; this allows for feedback on Z, θX, and θY by observing three different positions. Using one microscope to perform the alignment may be tedious since it requires going between each of the positioning field until complete alignment was achieved.

Vibration Control. Vibration is an important issue when working in the micron and sub-micron size regimes. If vibration is not controlled, it can cause unstable imaging during observation with the microscope. In addition, it can also distort alignment before evaporation since there is no feedback mechanism to correct for shifts after initial alignment under the microscope. To control vibration, it's important to first isolate the vibration source and this was achieved through the use of a vibration isolation platform where the microscope and alignment stage rested on. Additionally, the microscope and alignment stage should be physically connected to the same vibrational platform without any isolation pads in between. For example, the microscope stand has isolation pads that separated it from the platform while the alignment stage was rested on the platform and that alone was enough to induce noticeable vibration during observation under high magnification.

Rev. 1 Alignment Stage. Ideally, the entire alignment system should be inside a vacuum chamber to prevent oxygen and water from degrading the organic layers but such a system is difficult to build and is expensive. A vacuum setup with a microscope will require remote control of camera movements to each location to view the alignment and in addition, will need to be moved away during the evaporation. The stage will also need to be remotely controlled from outside of the chamber. Fortunately, a goal was to perform a proof of concept for using SNM to pattern organic material for microdisplays where lifetime issues from oxygen and water exposure of the organic materials is not a factor. This allows us to use an alignment and registration system outside of the vacuum chamber. This however does introduce another issue where care is then needed for controlling the aligned substrate and SNM as it is transported to the deposition system.

Figure 31:
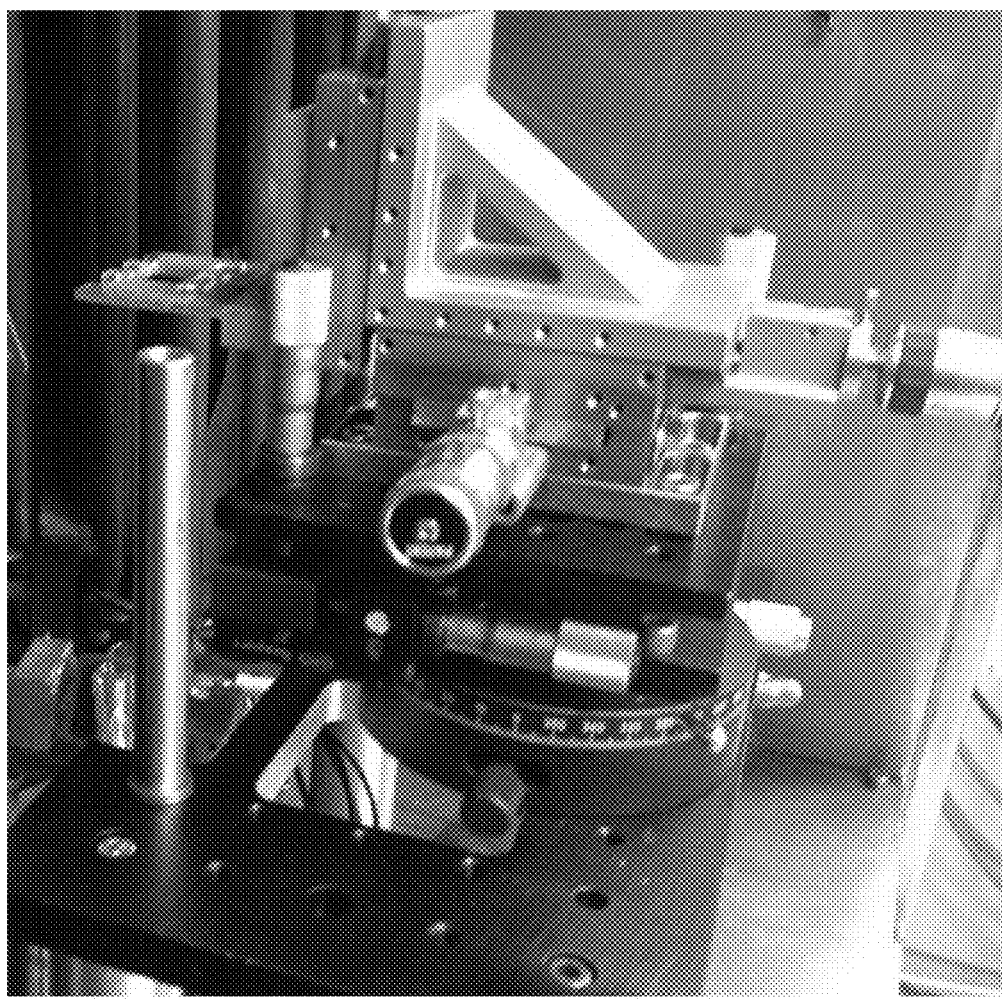
FIG. 31 illustrates an alignment stage rev. 1, 6 axis stage that was pieced together with manual positioners.

The first stage built to perform the alignment of the shadow mask and silicon nitride shadow mask were pieced together from available parts in the lab. A manual XYZ stage, Newport "ULTRAlign™ Integrated Crossed-Roller Bearing Linear Stage, 25.4 mm XYZ" was mounted on top of a manual θXθYθZ stage, Newport "Tilt and Rotation Platform" which then mounted on top of an Edmund rotation stage and is shown in FIG. 31. The XYZ stage stock micrometers have a minimum increment of 0.01 mm travel and were replaced with "High Precision Adjuster, 8.0 mm Coarse Travel, 0.3 mm Fine Travel" from Newport which has a minimum incremental motion of 0.02 µm.

Figure 32:
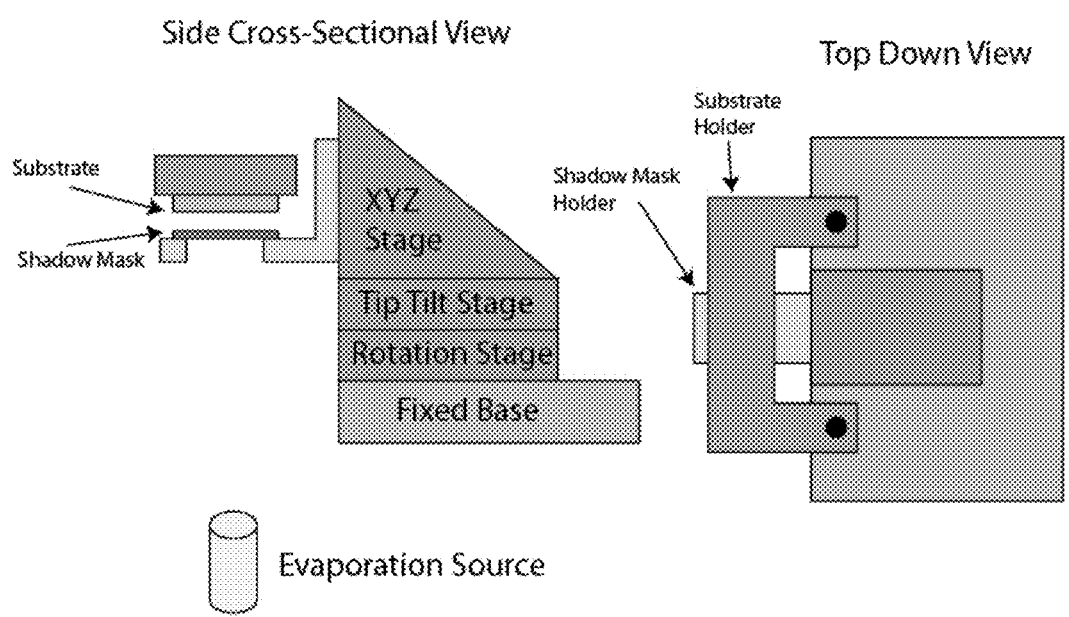
FIG. 32 is an example of an alignment stage rev. 1 diagram (not drawn to scale) wherein left shows the side cross-sectional view of the 6 axis stage when the shadow mask holder hangs off to the side and holds the SNM, the substrate holder suspends the substrate over the SNM, and the evaporation source sits below the SNM and substrate during the evaporation and the right image shows the top down view specifically showing the assembly of the substrate holder.

FIG. 32 shows a side cross-sectional diagram and a top down view of the rev. 1 alignment stage which was setup for a standard bottom up evaporation configuration where an arm protrudes away from the stage to facilitate the evaporation. The arm holds the SNM and was positioned onto the substrate that was fixed onto the substrate holder which was then connected to the base. There are inherent issues with this design such as the center of axis issue, where the alignment stage and shadow mask center of axis do not match, causing alignment between the shadow mask and substrate to potentially be challenging. Manual motion was also a potential issue during usage of this stage where trying to move the micrometers induced motion in the system and interfered with imaging and motion control.

Figure 33:
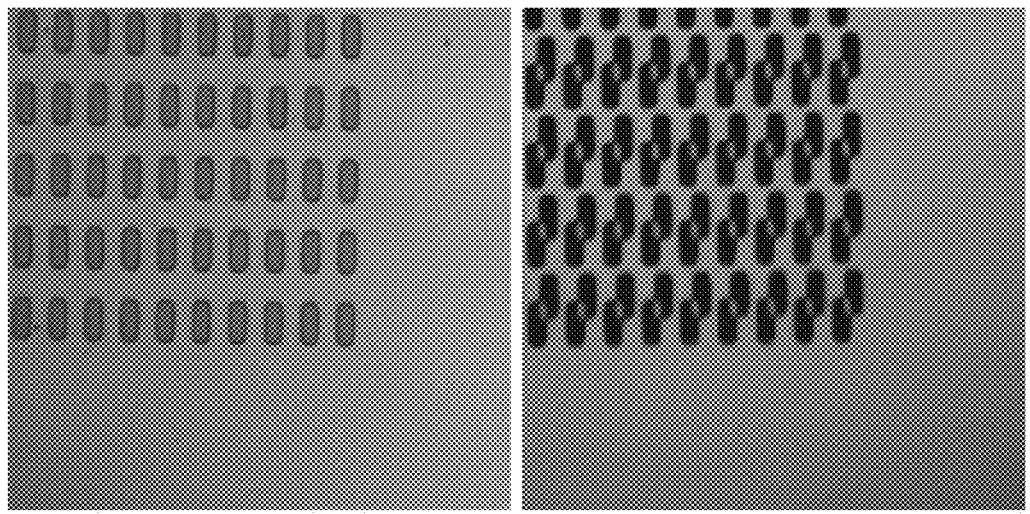
FIG. 33 is an example of a stage reliability test where both images shows the results after two Alq3 depositions, each at 100 nm thick on a silicon substrate through a SNM with pixel pattern 2 wherein the left image shows the color of 200 nm Alq3 where both evaporations completely overlap and the right image shows a shift in the second deposition where the black is the color of 100 nm of Alq3 and blue is where the pattern overlaps.

Stage Reliability Experiment. Before performing alignment and depositions with this stage, the stage reliability needs to be determined if it can hold an accurate alignment throughout the entire process. One concern that can induce alignment error is the movement of the alignment stage from the microscope/vibrational stage to the vacuum chamber. Another concern was the vacuum chamber itself where there are vibrations from the rough pump, turbo pump, and valves. Lastly, there were concerns over alignment errors from heating during deposition and from change in pressure. The experiment to determine reliability and repeatability of the rev. 1 alignment stage was to position the SNM into contact with a silicon substrate and perform a deposition. The alignment error variable is then introduced and another deposition is performed. The resulting pattern from this experiment is then observed. One key attribute to this test is that the deposited material has different colors with different thicknesses. If there is no shift, the substrate will have a pattern that is a replica of the SNM apertures with the color of the total thickness of the two runs. If there is a shift, then the substrate will have two overlapping patterns with the color of one thickness where they don't overlap and the color of the combined thicknesses if they do overlap and is shown in FIG. 33.

From the reliability testing, there was no alignment shift from the vacuum system, heating, or from pressure change. However, there was a significant amount of alignment shift that resulted from the movement of the alignment stage to the vacuum chamber. From this result, a new alignment system was fabricated to prevent alignment shift during movement of stage from the microscope to the vacuum chamber.

Figure 34:
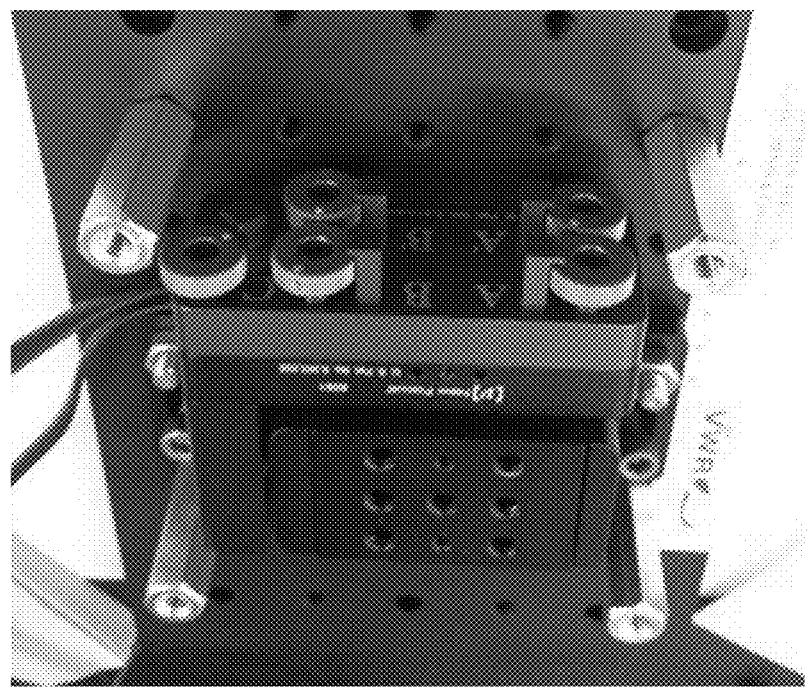
FIG. 34 is a "Newport 8081 Motorized XYZθxθy Tilt Aligner" stage on a baseplate with posts to hold the mask holder.

Rev. 2 Alignment Stage. A major improvement that the alignment stage will need is the ability for the stage to hold its position. To achieve this, a piezoelectric stage will be used instead of a manual stage where one of its key features is holding its position when it's not actuated. Another benefit of a piezoelectric stage is the small incremental motions when compared with manual stages. In addition, since the stage is electrically driven, there is no user induced motion during the alignment process which drastically improves the alignment process. The alignment stage purchased to perform the alignment step is "Newport 8081 Motorized XYZθXθY Tilt Aligner" and is shown in FIG. 34. The piezoelectric motor for this stage offers minimal incremental motion of 30 nm. One axis was missing in this setup, but a work around was done by adding aluminum foil spacers between the mask holder and the post, where different tightness allowed for a slight range in θZ.

Figure 35:
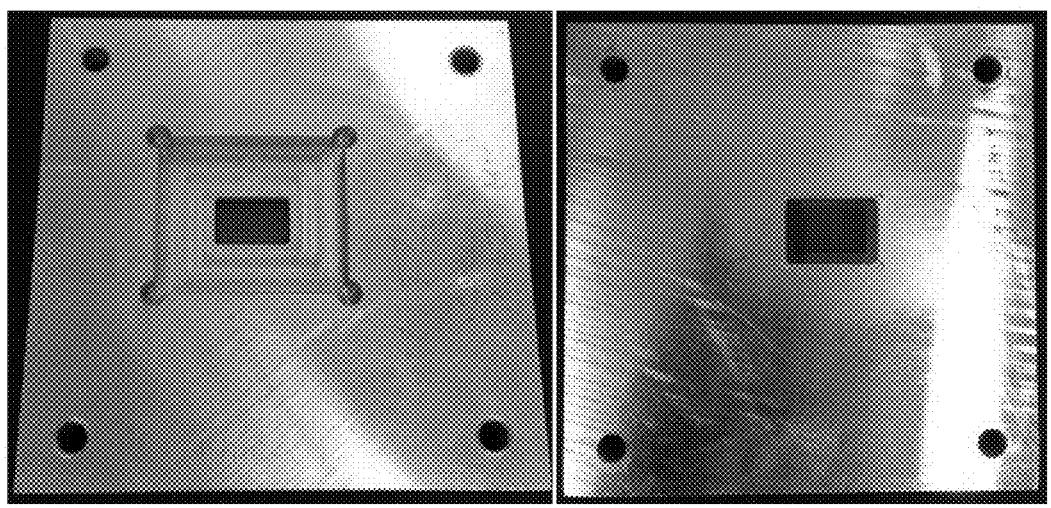
FIG. 35 is an example of a shadow mask holder wherein the left image is the surface that is closer to the microscope where the recess facilitates the small working distance of the microscope lens, allowing for observation of the SNM and substrate and the right image is the surface that the SNM is held and will face the substrate.
Figure 36:
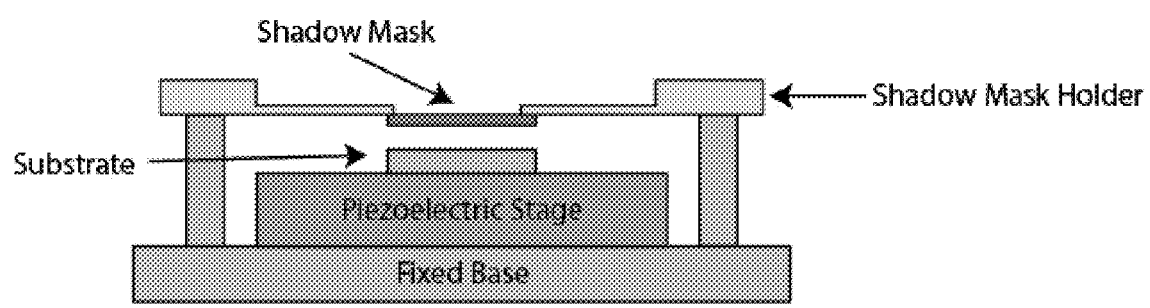
FIG. 36 is an example of a rev. 2 alignment stage cross-sectional diagram (not drawn to scale) wherein the piezoelectric stage is fixed onto a base and posts hold up the shadow mask holder and the substrate is fixed onto the piezoelectric stage and the shadow mask is held away from it.

The Newport piezoelectric stage was mounted onto an aluminum base that contain posts that holds the shadow mask holder as shown in FIG. 35. The SNM was glued to the mask holder with the front-side surface facing away from the mask holder. The other side of the mask holder was recessed, to allow the microscope to be brought to within working distance from the SNM and substrate. A cross-sectional diagram of the rev. 2 alignment stage is shown in FIG. 36. The resulting alignment setup was significantly smaller and lighter than the rev. 1 alignment stage and was small enough to fit underneath the microscope on the x-y stage. The alignment setup was also made to be flipped over to perform a bottom up evaporation. This alignment stage also improves upon the first design where the center of axis for the stage and substrate was aligned, dramatically helping the alignment. The rev. 2 alignment stage was subjected to the same reliability testing of the rev. 1 alignment stage and the result did not show any alignment shift as the rev. 2 alignment stage was brought from the microscope to the vacuum system.

Patterning with SNM. Introduction and Deposition Conditions. The first set of depositions were performed with the SXGA chips and showed reasonable alignment but the resolution limits may not be easy to distinguish due to overlapping organics with the same color. To better determine resolution limits, a higher resolution display along with a new SNM without oversized features and separate colors were used. Gap effects on the deposition profile were also examined with the higher resolution pattern.

Spacing of Shadow Mask and Substrate. For the patterning of the display substrates, the SNMs were to be placed into direct contact with the substrate, however, there were many issues that made contact patterning potentially challenging. Due to the work being done outside of a cleanroom, particles typically end up on either the SNM or on the display substrates. When these particles are in the silicon nitride membrane region and are greater than a micron, it will cause a deflection of the SNM, resulting in improper patterning. Particles that are in between the SNM and substrate on the non-membrane areas would cause non-controlled shifts during fine alignment and in addition, caused shifting during the steps between alignment and deposition. A spacing of greater than or equal to 5 µm was used that helps prevent some of these alignment issues from smaller particles. Larger particles are typically easier to remove with pressurized dry nitrogen and can be managed easier. Performing this work in a cleanroom can significantly help with the debris issue.

Figure 37:
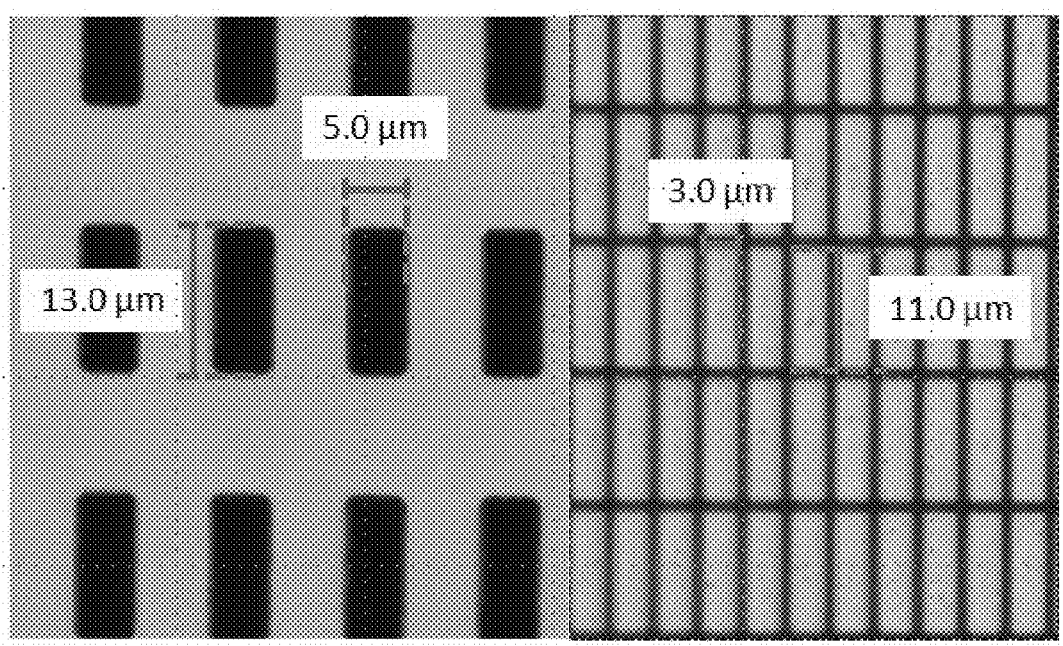
FIG. 37 are optical micrographs wherein the left shows an example of a SNM with pixel pattern 2 where the pixel apertures are 5.0×13.0 µm and the right shows the SXGA substrate with 3.0×11.0 µm sub-pixels anodes.

Patterning of SXGA Display Devices. To demonstrate the ability to pattern with SNM, an eMagin SXGA display device was used with a full SNM with pixel pattern 2. The organics that were deposited was 100 nm of Alq3, which is visible under normal imaging with a microscope. FIG. 37 shows images of the SNM and the SXGA device that will be patterned. The SNM used are from the new lot with aperture sizes of 5.0×13.0 µm. The sub-pixel anodes are 3.0×11.0 µm. For the depositions performed, the SNM was held at a spacing of about 8 µm away from the substrate. A total of four depositions were performed to show the ability to accurate align, position, and deposit onto the SXGA display substrates.

Figure 38:
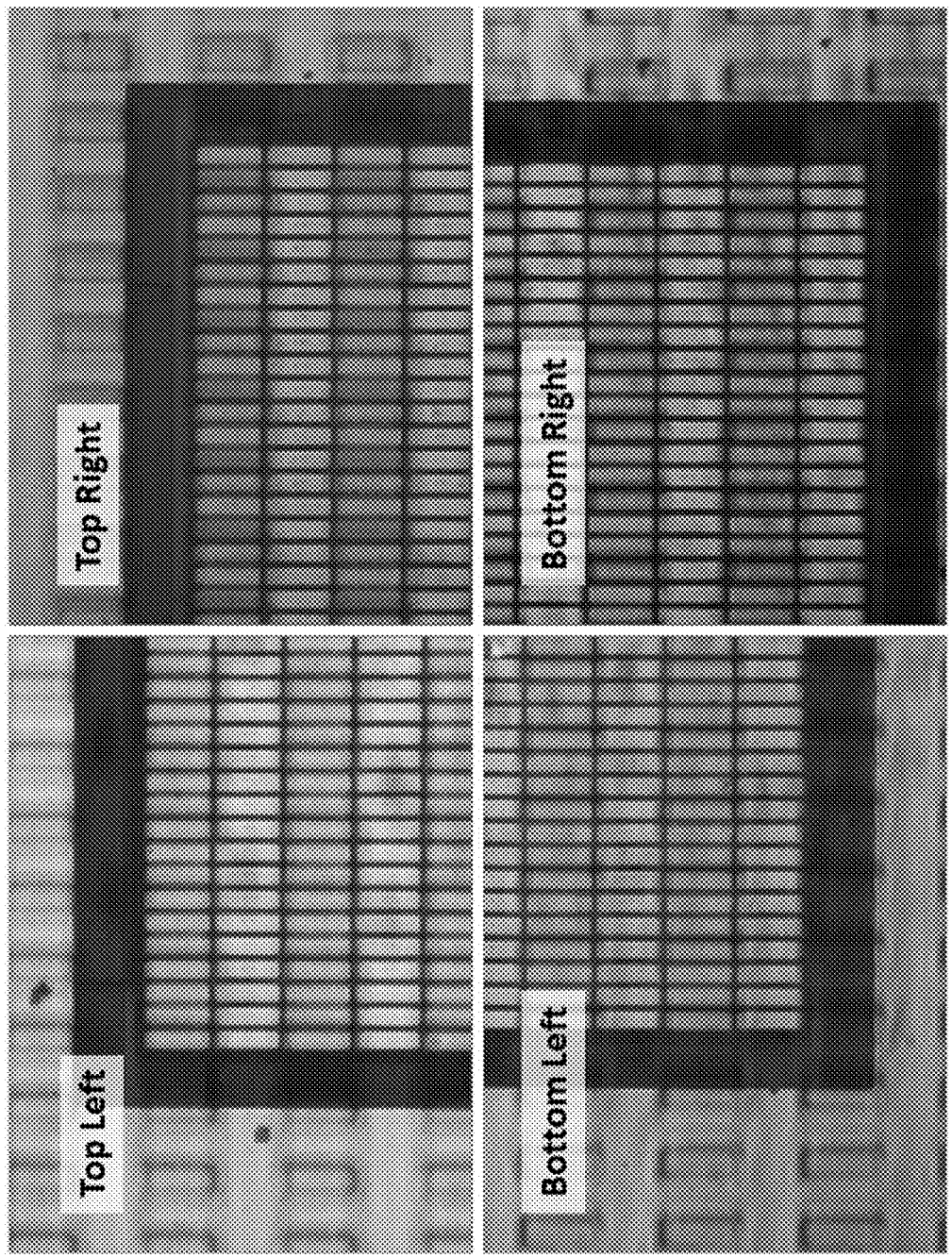
FIG. 38 illustrates a first deposition on a SXGA display substrate with the full membrane of pixel pattern 2 wherein each image shows each corner of the display active area.
Figure 39:
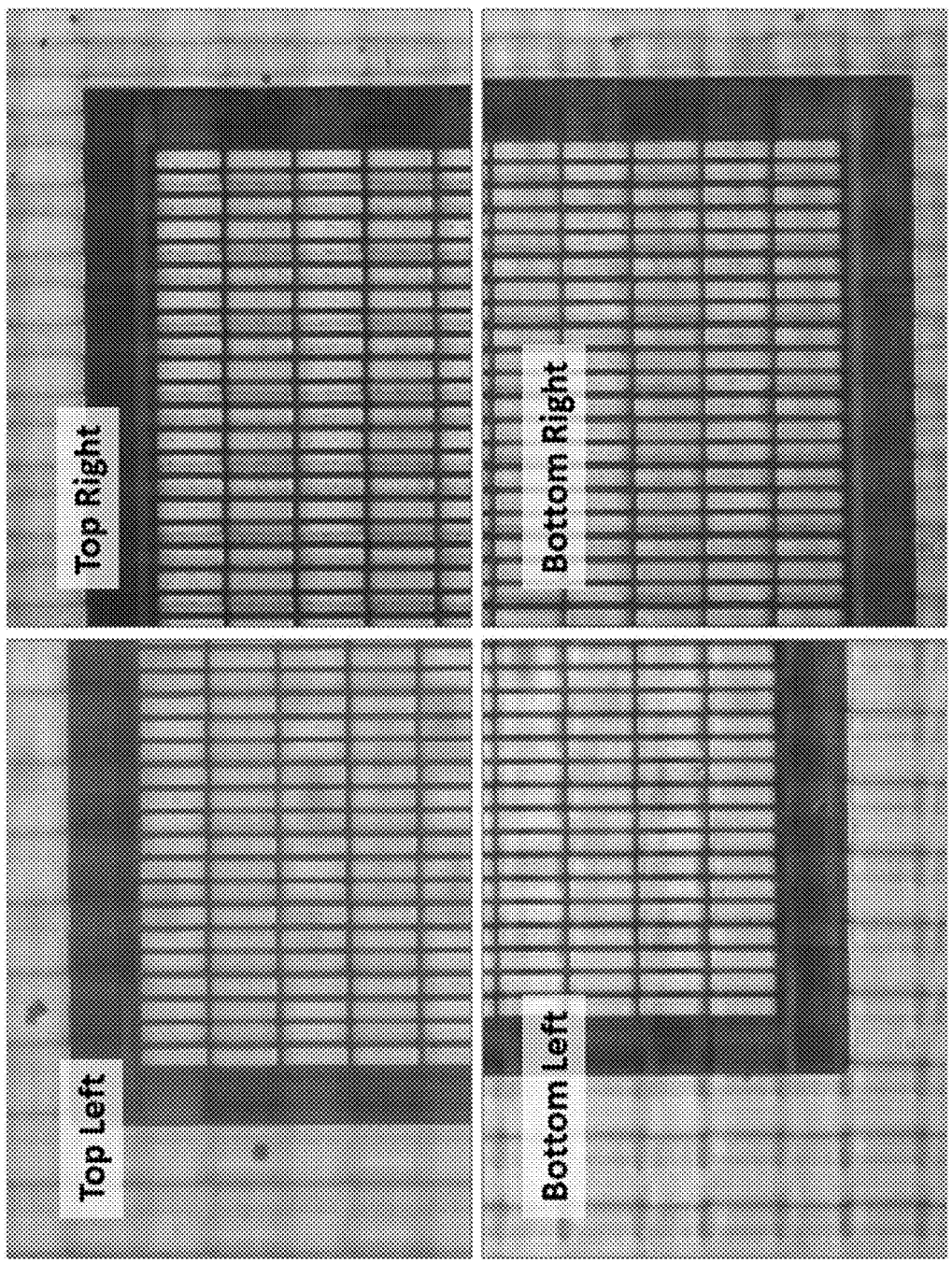
FIG. 39 illustrates a second deposition on the SXGA display substrates with the full SNM shifted down by 12 µm wherein each image shows each corner of the display.
Figure 40:
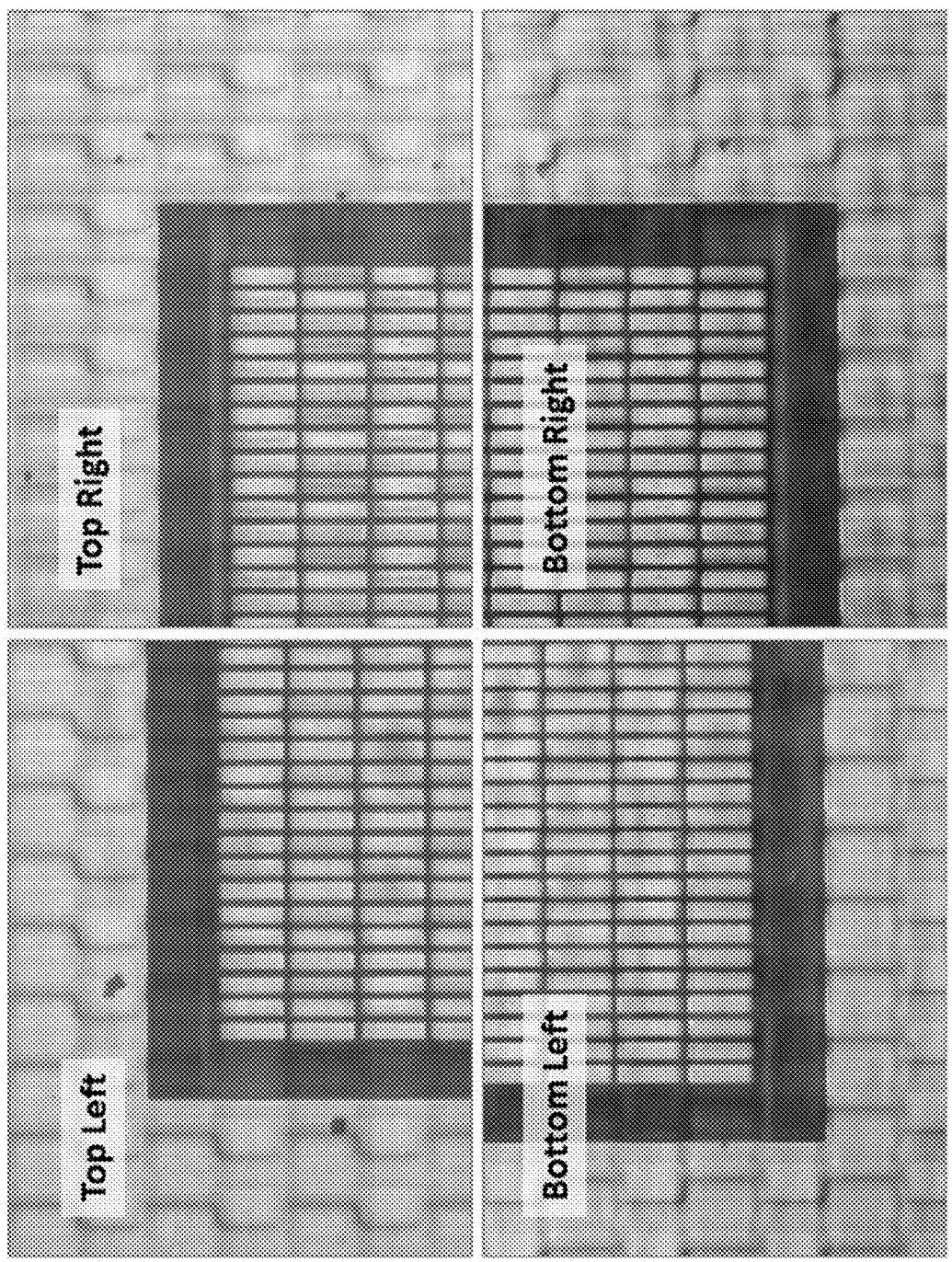
FIG. 40 illustrates a third deposition on the SXGA display substrates with the full SNM shifted right by 4 µm wherein each image shows each corner of the display.
Figure 41:
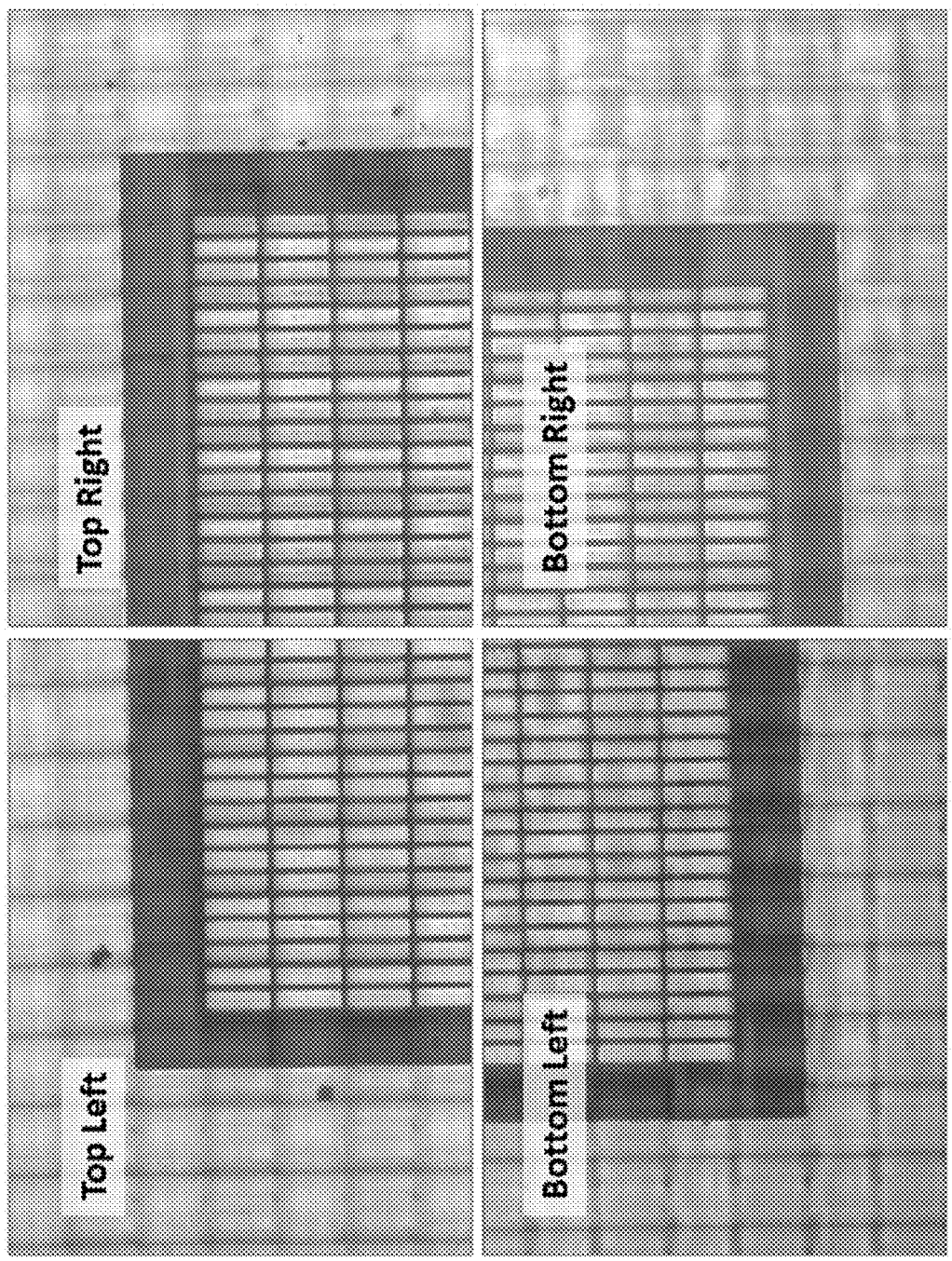
FIG. 41 illustrates a fourth deposition on the SXGA display substrates with the full SNM shifted up by 12 µm wherein each image shows each corner of the display.

The first deposition, FIG. 38, shows the deposition of Alq3 aligned with the left sub-pixel. The figure also shows an image of each of the corners, showing fairly accurate alignment to within a micron of the sub-pixel anode. The images taken of the substrate and pattern are through the silicon nitride, so some distortion of the imaging was due to an out of focus silicon nitride film. Image distortion from the SNM was very noticeable for the images on the right in FIG. 38, causing difficulty in positioning measurements. FIG. 39 shows the second deposition with the shadow mask shifted down 12 µm to complete the row and again, the deposition was roughly within a micron and has formed a line of organic material. From the image, the right side depositions are slightly shifted to the right by about half a micron while no distortion to the left side pattern was evident suggesting either the mask or substrate not being the same size. FIG. 40 shows the third deposition with the shadow mask shifted 4 µm to the right to start the next row of depositions and appeared to be roughly with a micron of the targeted sub-pixels across the entire display. FIG. 41 shows the fourth deposition with the masks shifted up by 12 µm to cover the second column of sub-pixels, completing the column of organic material. Additional depositions were not performed since optical registration would be difficult and having four depositions means it was already difficult to determine the position of each deposition. Color difference from overlap was not evident with this display substrate as it was with the silicon substrate, possible from differences in thin film interference.

The ability to accurately align and deposit repeatedly with a SNM onto the SXGA display substrate was demonstrated. Deposition position accuracy with respect to targeted anode was difficult to determine due to overlapping depositions from oversized apertures. The resulting deposition size could not be easily determined either as a result of the SNM oversized aperture or resulting overlap of multiple depositions. More accurate alignment and depositions can now be attempted with multiple colors observed under PL imaging.

Figure 42:
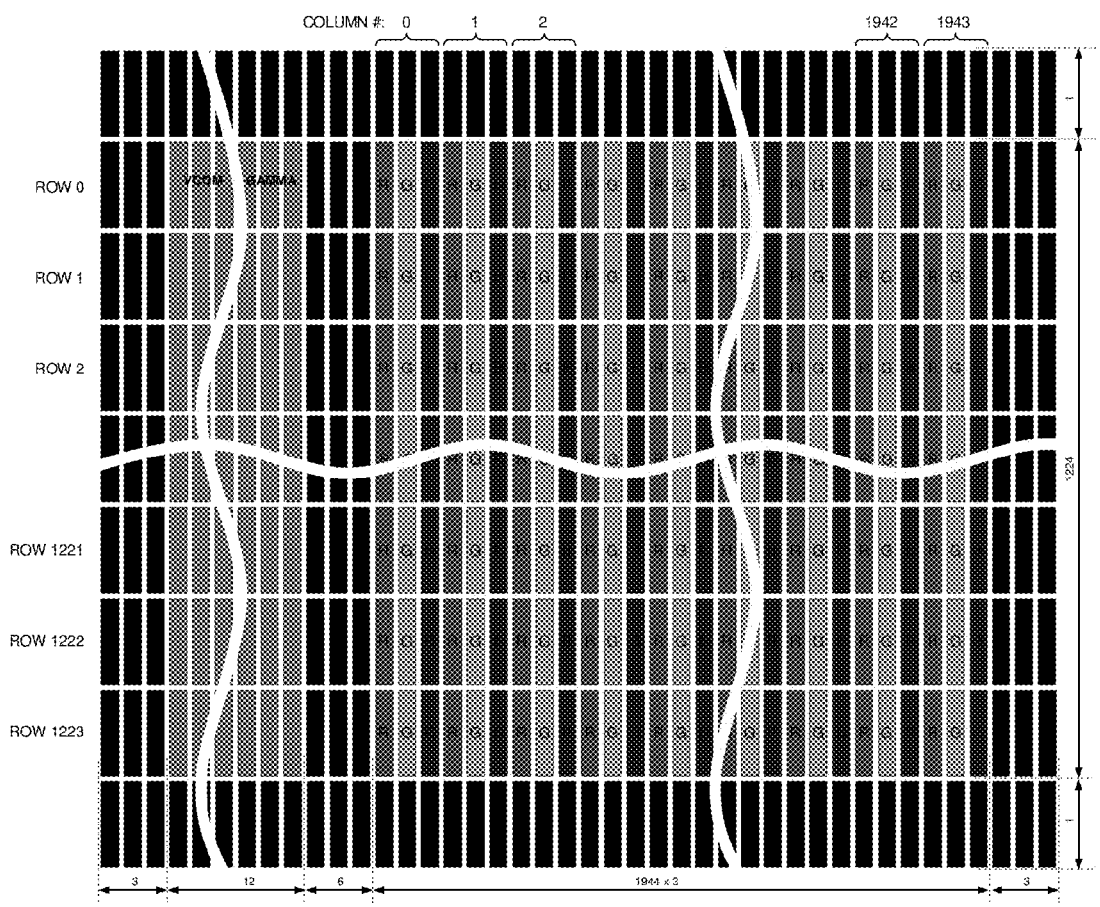
FIG. 42 is eMagin's WUXGA display substrate pixel array layout wherein there are 1944×1224 pixels and each pixel consists of three sub-pixels with the colors red, green, and blue and the color sub-pixels are arranged in columns.

Patterning of WUXGA Devices. To better characterize the patterning process, a SNM without oversizing was used. In addition, a higher resolution device should also be used to determine the patterning limitations. The higher resolution device that was used was the WUXGA display from eMagin. PL imaging was used to observe for positioning accuracy of the different colors and potential mixing that could occur. Gap effects on resulting patterns were also explored.

eMagin WUXGA Substrate. The eMagin WUXGA display use single crystal silicon backplane based display substrate that drives current through a white OLED while color was achieved through the use of color filters. The WUXGA display has a resolution of 1920×1200 pixels but has an extra 24 columns and 24 rows of pixels for alignment and test purposes as shown in FIG. 42. The pixel pitch was 9.6×9.6 µm and was made up of three sub-pixels that are individually 3.2×9.6 µm. The active area of each sub-pixel (anode) was 2.45×8.85 µm. With the direct color patterning of OLED, the organics will need to completely cover the active area of the individual sub-pixel. The active display area for the WUXGA substrate was 18.74×11.77 mm or 22.13 mm (0.87") in diagonal.

Figure 43:
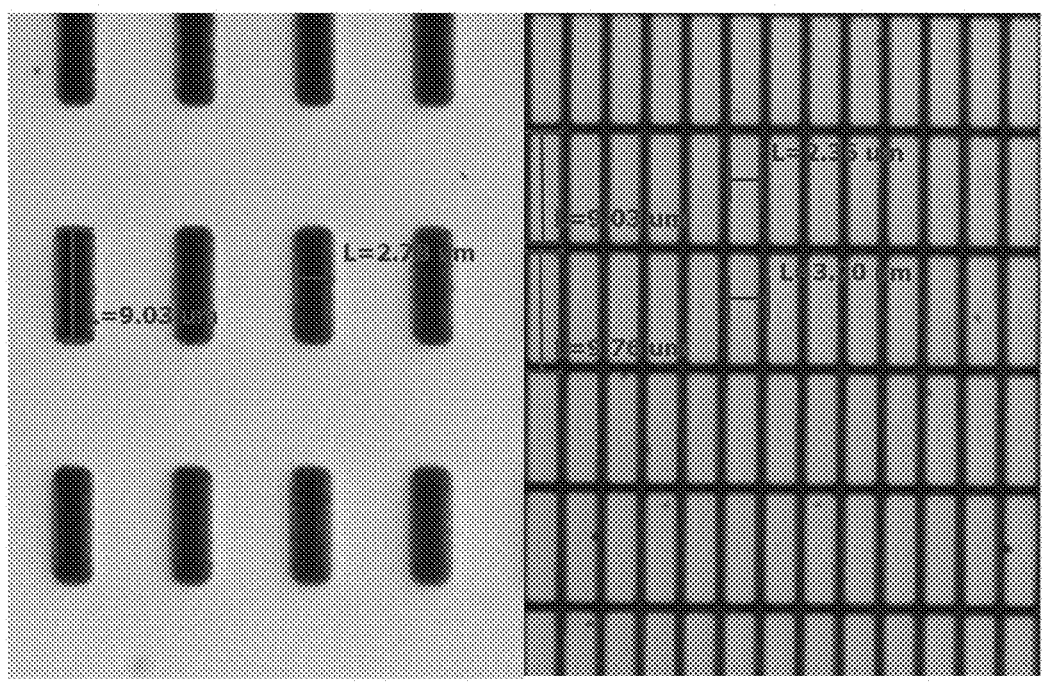
FIG. 43 are optical micrographs where left shows the WUXGA SNM with pixel aperture of 2.8×9.0 µm and right shows the SXGA substrate with 2.4×9.0 µm sub-pixels anodes.

WUXGA SNM. The WUXGA SNM with 1 µm thick silicon nitride was designed to span the full display with an alternating sub-pixel aperture layout. Using the aforementioned process improvements, the resulting opening aperture size produced on the SNM was 2.8×9.0 µm, slightly smaller than the sub-pixel pitch which was 3.2×9.6 µm but slightly larger than the sub-pixel anode of 2.45×8.85 µm design, an ideal size. FIG. 43 shows an optical micrograph of the WUXGA shadow mask and the WUXGA substrate where the aperture on the mask was 2.8×9.0 µm and the WUXGA substrate anode was 2.4×9.0 µm. There was some rounding of the corners in the SNM from the etch process.

Figure 44:
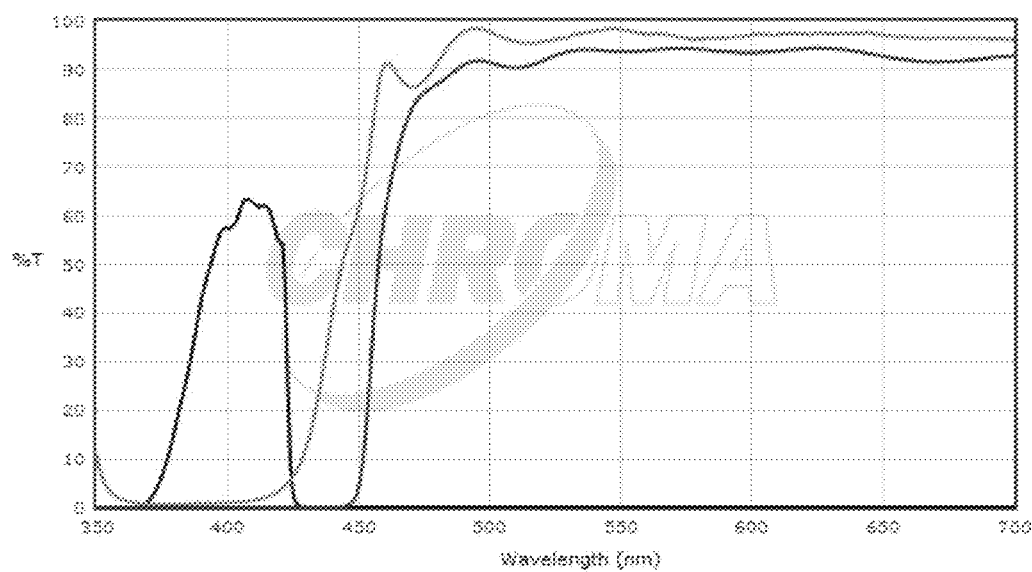
FIG. 44 is a Chroma 11005v2—Violet fluorescent filter set wherein blue is the excitation filter, green is the dichroic beamsplitter, and the red line is the emission filter.

Color Patterning. The prior patterning of the SXGA devices showed patterning only through optical imaging and didn't show any potential overlap and differentiation between neighboring sub-pixels. To better show the positioning between patterned sub-pixels, different colored PL organic materials were deposited. The organics that were deposited were Alq3 for green, and DCJTB doped Alq3 for orange and red depending on the DCJTB concentration. Alq3 with 2% of DCJTB would emit red and Alq3 with 0.5% of DCJTB would emit orange. A layer of NPB, a hole transporting material was blanketed onto the substrate to prevent the aluminum anode from quenching the photoluminescence from the Alq3 and DCJTB. The layer of NPB also emits a slight blue color under photoluminescence. The PL imaging was taken with a Ziess AxioImager and utilizes a "chroma 11005v2—Violet fluorescent filter set" where the excitation is in the UV and deep blue (375-475 nm) and the emission filter allows blue through red (450-700 nm). The filters transmission data is shown in FIG. 44.

Figure 45:
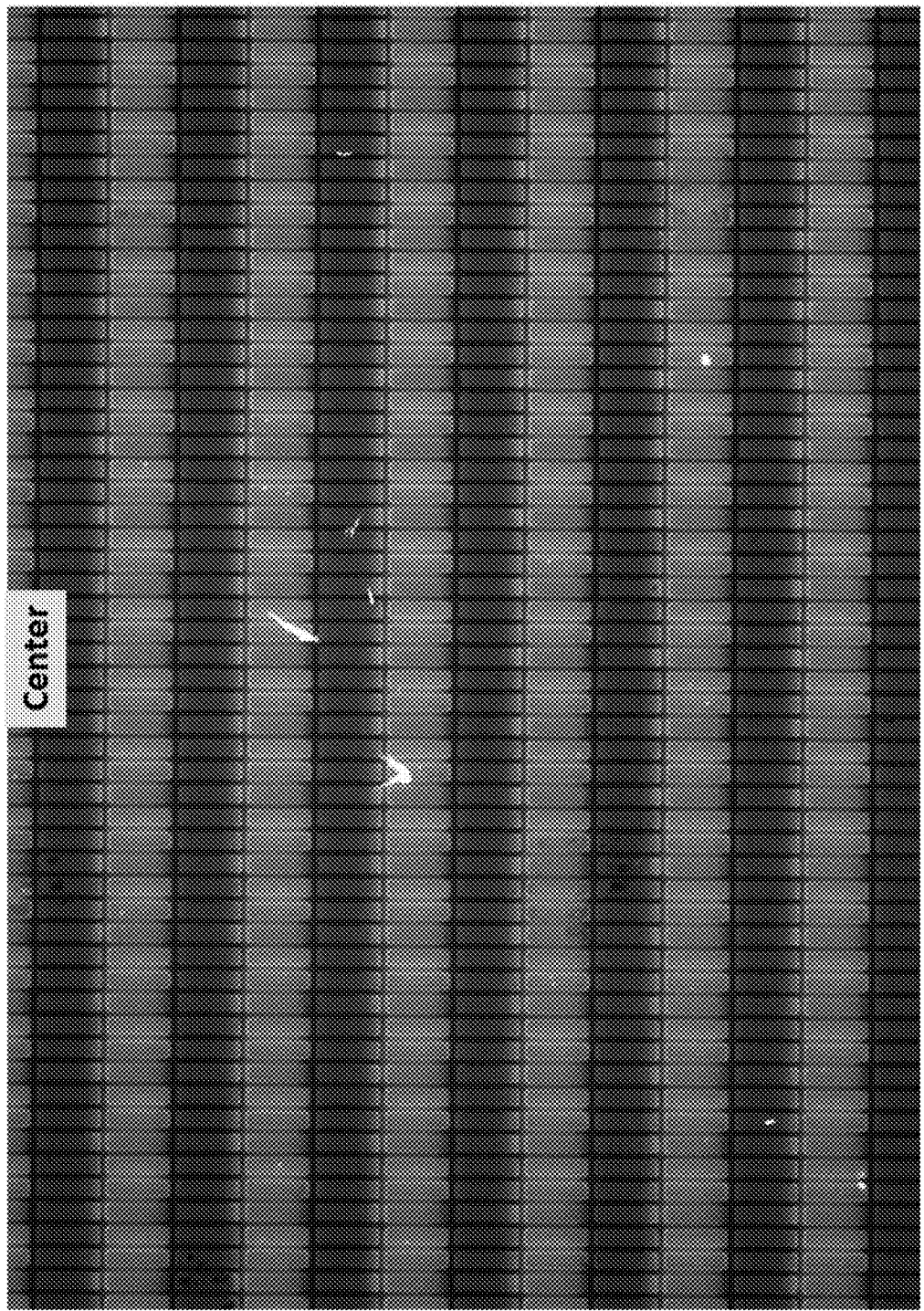
FIG. 45 is a PL image of the center of an example of a patterned WUXGA substrate wherein only three depositions were performed: one deposition of red, green, and orange and the blue is from a blanket of NPB underneath the patterned Alq3 and DCJTB to prevent quenching.
Figure 46:
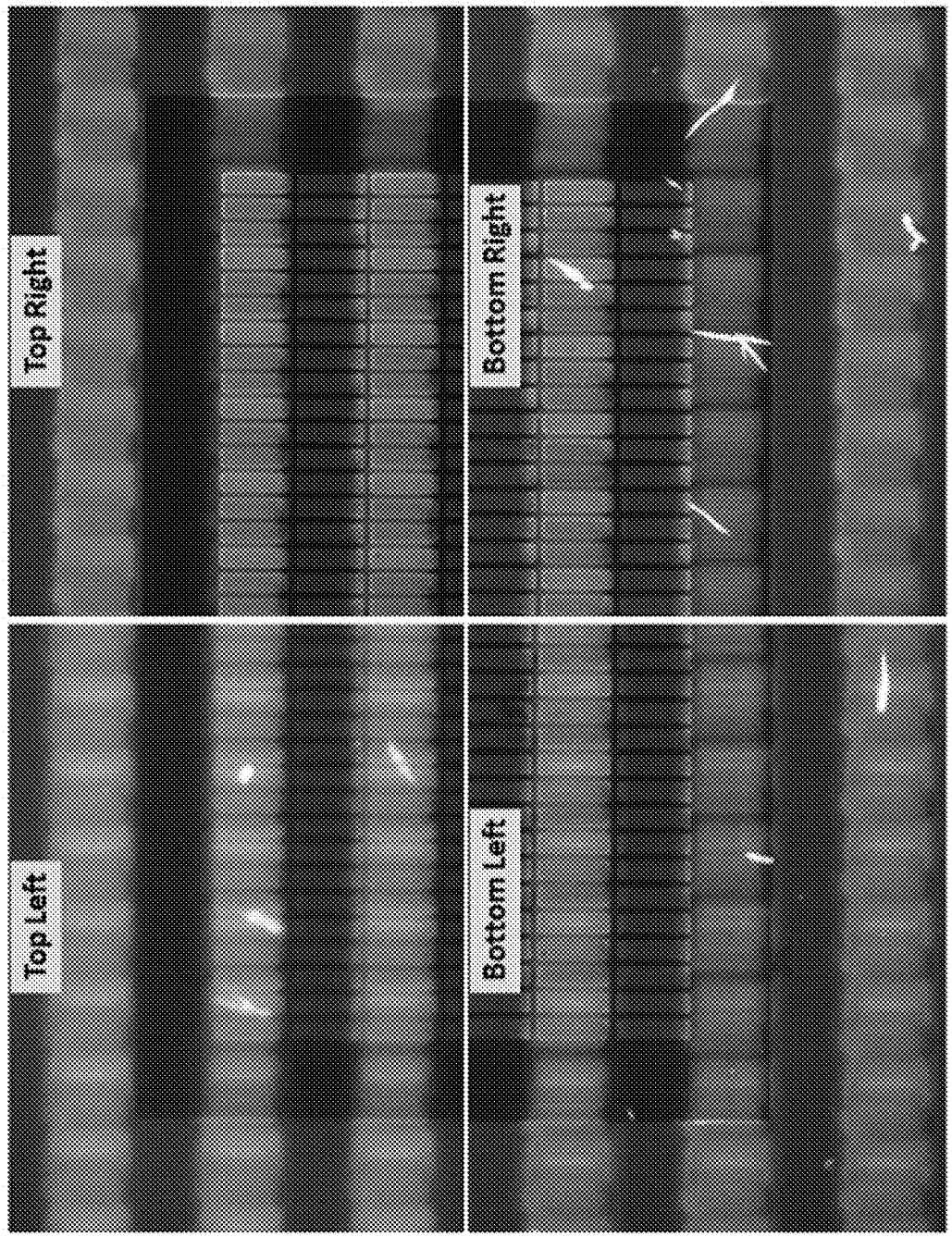
FIG. 46 are PL images of each corner of the substrate in FIG. 45 wherein the dull colors are from the degradation caused by the light from the microscope during the alignment of the shadow mask to the substrate.

FIG. 45 and FIG. 46 show PL images of the WUXGA device with a 60 nm blank layer of NPB on top of the anodes with subsequent pattern depositions of red, green and orange organic materials. The SNM to substrate gap for the three depositions was 13 μm. FIG. 45 shows an image from the center of the device where there was a straight (source directly underneath the substrate) deposition. There was noticeable offset in the +y direction for each of the three deposition throughout the substrate, which was as high as +1.9 μm. FIG. 46 shows each corner of the WUXGA device, where color was degraded from the deposition alignment due to microscope light. FIG. 46 also shows the deposition shift, $d_s$, moves away from the targeted anode, always away from the source, a result of the offset source. The resulting offset can be calculated with equation (2). It was determined to be about 1 μm in the x direction and about 0.6 μm in the y direction (a=3 μm, h=130 mm, g=13 μm, $l_x$=10 mm, $l_y$=6 mm, s=10 mm, and t=1 μm). Table 3 summarizes the x and y misalignment values observed in FIG. 45 and FIG. 46. Also listed in Table 3 are the misalignment values with compensation for the deposition shift, $d_s$, resulting from an offset source. After accounting for the offset source in the x direction, there was very little misalignment in the x-direction. However, there was a systemic offset of the SNM to substrate in the +y direction. Overall, accounting for the shifted depositions shows true misalignment to be significantly less than the initial misalignment values; resulting misalignments were mostly under one micron.

Figure 47:
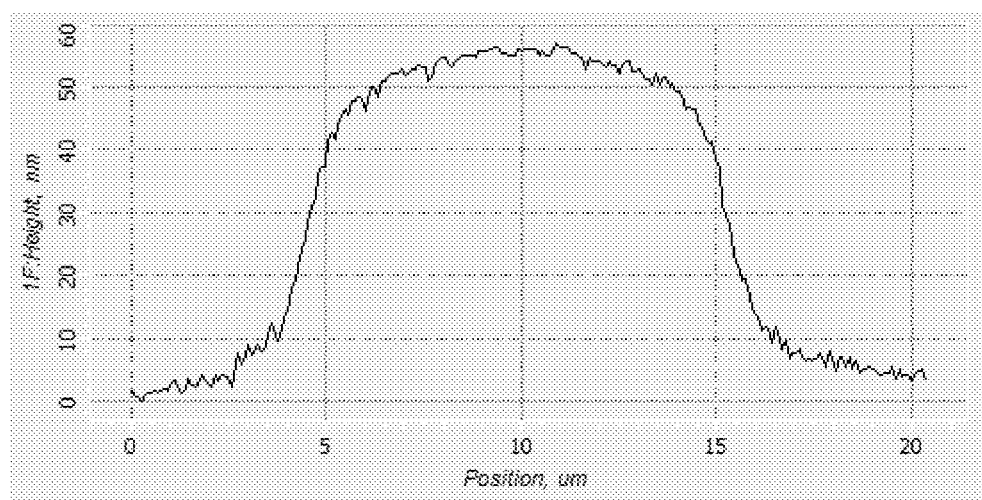
FIG. 47 is a 1D height profile taken with AFM from one of the patterned organics from FIG. 46 along the y-axis showing a full width of 12 µm and the bulk of the deposition is approximately 10 µm.
Figure 48:
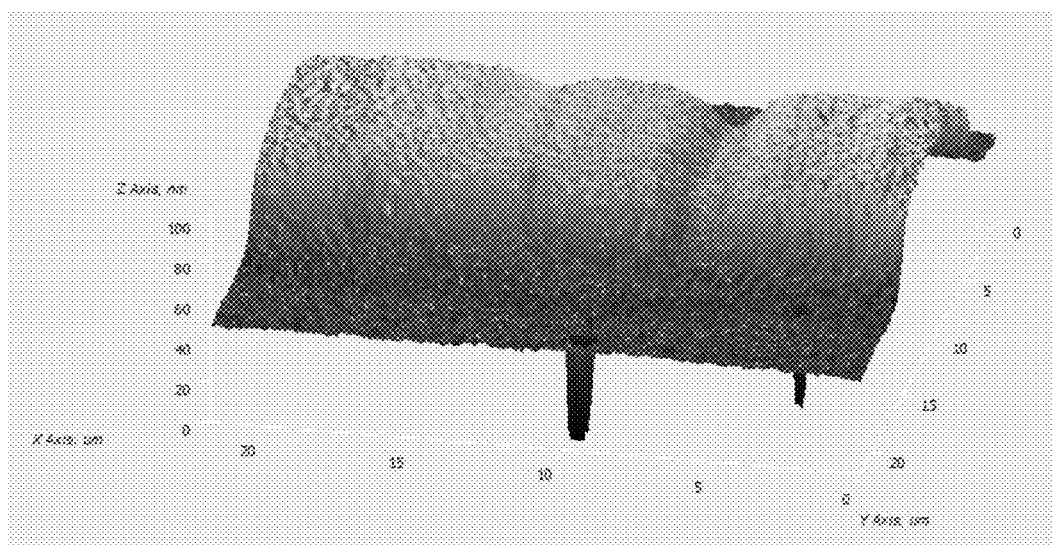
FIG. 48 is a 3D height profile taken with AFM from the patterned organics shown in FIG. 46 wherein the profile shows approximately 4 patterned pixels side by side where two depositions are spaced slighter further apart and another two depositions are overlapping partially causing accumulation at the overlap.

The oversizing from the gap was also noticed in the images shown in FIG. 45 and FIG. 46. A better representation of the size of the deposition can be seen with an atomic force microscope (AFM). FIG. 47 shows a height profile using AFM of one pixel in FIG. 46 along the y-axis, where the full width in the y-direction was approximately 12 μm. The theoretical deposition profile width along the y-direction was calculated with equation (1) and was determined to be about 10.0 μm. The bulk of the deposition from FIG. 47 was approximately 10 μm. FIG. 48 shows a 3D height profile taken with AFM from the patterned organics shown in FIG. 46. The profile shows approximately 4 patterned pixels side by side where two of the depositions are spaced slighter further apart and two depositions are overlapping partially causing accumulation at the overlap.

TABLE 3

Misalignment values (center of deposition to center of anode) for FIG. 45 and FIG. 46 in the x and y-direction along with misalignment values with deposition shift correction.

| | | Misalignment | | Misalignment with shifted deposition correction | |
|---|---|---|---|---|---|
| Location | Color | X-axis (μm) | Y-axis (μm) | X-axis (μm) | Y-axis (μm) |
| Top Left | Red | −1.5 | +0.6 | −0.5 | 0 |
| | Green | −1.2 | +1.3 | −0.2 | 0.7 |
| | Orange | −1.2 | +0.3 | −0.2 | −0.3 |
| Top Right | Red | +1.5 | +1.7 | 0.5 | 1.1 |
| | Green | +1.3 | +1.9 | 0.3 | 1.3 |
| | Orange | +1.3 | +1.1 | 0.3 | 0.5 |
| Bottom Left | Red | −1.5 | 0 | −0.5 | 0.6 |
| | Green | −1.3 | +0.6 | −0.3 | 1.2 |
| | Orange | −1.3 | 0 | −0.3 | 0.6 |
| Bottom Right | Red | +0.8 | +1.3 | −0.2 | 1.9 |
| | Green | +1.3 | +1.3 | 0.3 | 1.9 |
| | Orange | +1.1 | 0 | 0.1 | 0.6 |
| Center | Red | 0 | +1.6 | 0 | 1.6 |
| | Green | 0 | +1.2 | 0 | 1.2 |
| | Orange | 0 | 0 | 0 | 0 |

Figure 49:
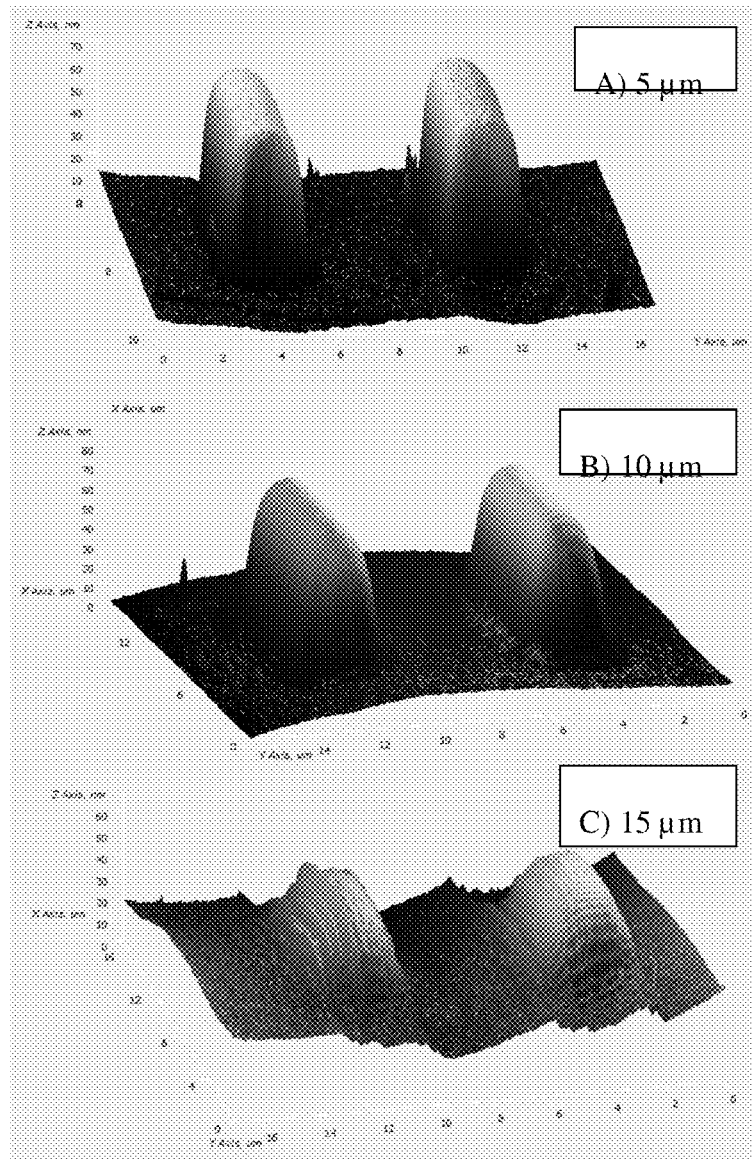
FIG. 49 are 3D AFM of two patterns from a clean WUXGA mask with an Alq3 deposition thickness of 70 nm from different gaps where A) is a gap of 5 µm, B) gap of 10 µm, and C) gap of 15 µm.

Gap induced effects of WUXGA Pattern. To quantify the effects of the gap, g, between the SNM and substrate, a series of different heights, 5 μm, 10 μm, and 15 μm were investigated using the WUXGA SNM where approximately 70 nm Alq3 was deposited through the SNM. FIG. 49 shows a 3D profile using AFM of two patterns for each of the different heights and the transition from being a fairly defined shape with sharp sidewalls, progress to rounded mounds of depositions. This feature can also be seen in the height profiles shown in FIG. 50 and FIG. 51.

Figure 50:
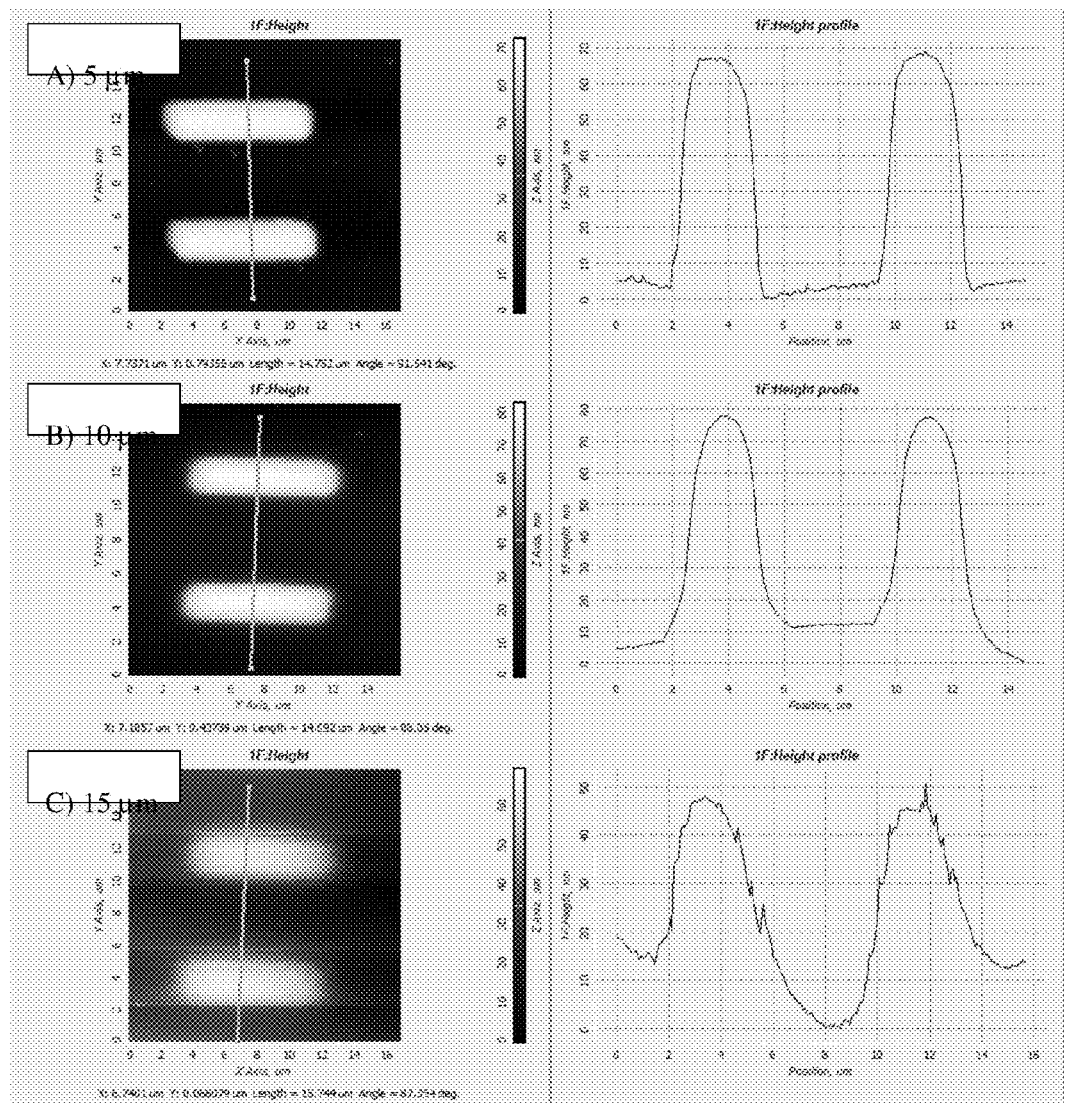
FIG. 50 are AFM showing the height profile across the width of two patterns from a clean WUXGA mask with an Alq3 deposition thickness of about 70 nm for different gaps where A) is a gap of 5 µm, B) gap of 10 µm, and C) gap of 15 µm.

FIG. 50 shows a height profile across the shorter width through two patterns. For varying heights of 5 μm, 10 μm, and 15 μm, the measured widths are from 3 μm, 4 μm, and 5 μm, respectively. The theoretical width calculated from equation (1) with an aperture width of 2.8 μm was 3.2 μm, 3.6 μm, and 4.0 μm for heights of 5 μm, 10 μm, and 15 μm, respectively.

Figure 51:
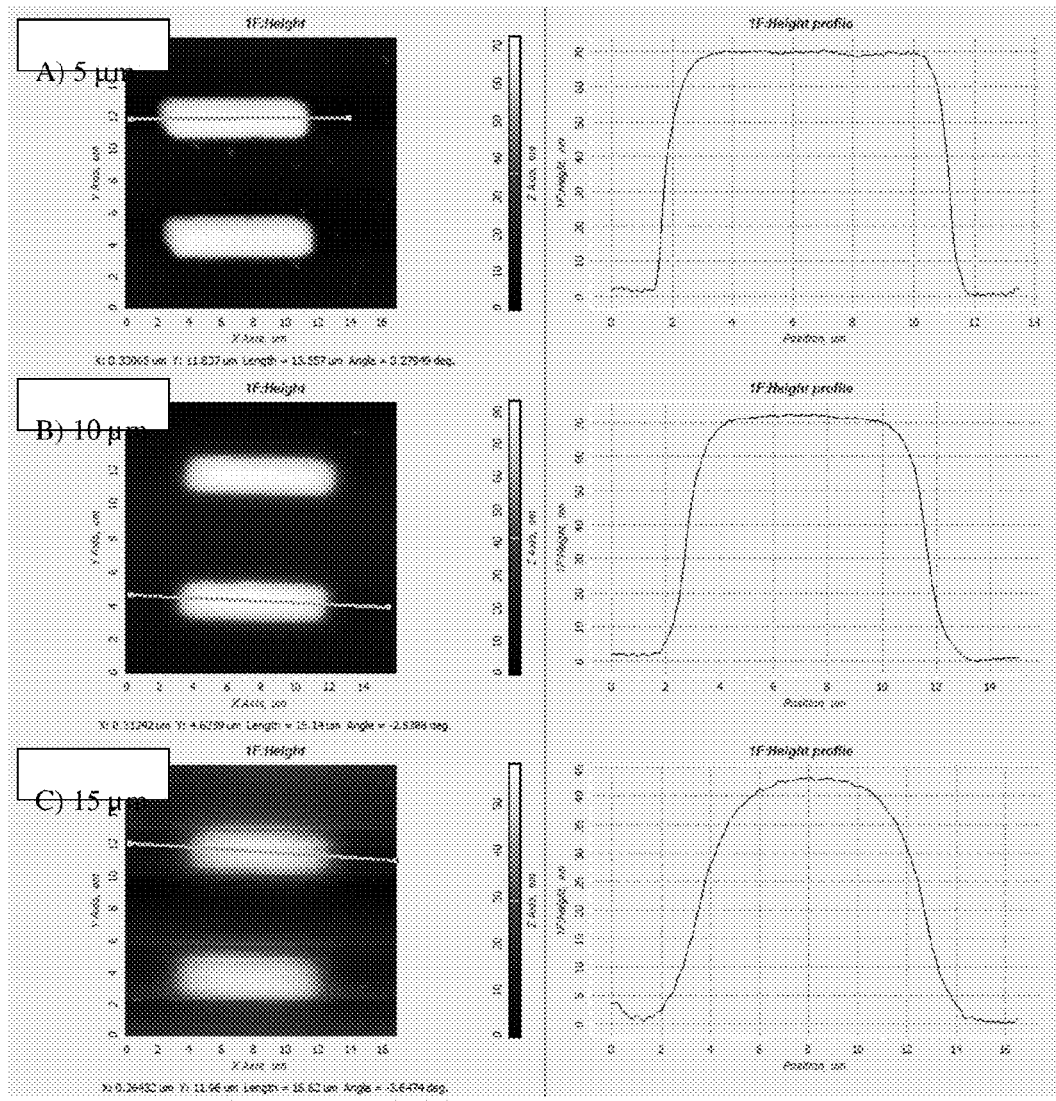
FIG. 51 are AFM showing the height profile across the length of one pattern from a clean WUXGA mask with a deposition thickness of about 70 nm for different gaps where A) is a gap of 5 µm, B) gap of 10 µm, and C) gap of 15 µm.

FIG. 51 shows a height profile across the longer direction of one pattern. For varying heights of 5 μm, 10 μm, and 15 μm, the measured widths are 9.5 μm, 10 μm, and 11 μm, respectively. The theoretical width calculated from equation (1) with an aperture of 9.0 was 9.4 μm, 9.8 μm and 10.1 μm for heights of 5 μm, 10 μm, and 15 μm, respectively.

From FIG. 50 and FIG. 51, the height of the depositions can also be determined. For the gap spacing of 5 μm and 10 μm, the deposited film thickness was 70 nm, the targeted thickness. However, when the spacing was increased to 15 μm, the deposited film thickness decreases to around 45 μm, much less that the total deposited thickness. It's hypothesized that the material was spreading so significantly that the center thickness was reduced.

The silicon nitride masks (SNM) were successfully utilized to perform SXGA patterning. Accurate patterning was possible using an oversized aperture. All 3×11 μm sub-pixel anodes had sufficient organic coverage from the 5×13 μm apertures with a substrate-mask spacing of 8 μm throughout the entire display. Accurate patterning was also achieved on a higher resolution (WUXGA) device with a SNM that did not contain oversized apertures. The patterning of the WUXGA device was most accurate for the center of the device, but due to a small source along with large mask-substrate spacing, the deposition accuracy declined from the center to the edge of the active area. When misalignments resulting from the mask-substrate spacing and offset deposition were considered, the actual positioning misalignment was typically less than one micron. The misalignment from the deposition offset can be reduced by decreasing the mask-substrate spacing from 13 μm to around 5 μm or less, but requires debris control. Color mixing was also a minor issue even with a gap of 13 μm.

The deposition spread observed in the experiments agrees with the theoretical calculations for small mask-substrate spacing up to 10 μm. From the AFM data, keeping the gap below 15 μm for aperture size of 2.8×9.0 μm may prevent a reduction of height. From the data, even if a mask-substrate spacing of 5 μm was used, there was still some spreading and should be taken into consideration for future SNM design. For the fabricated apertures of 2.8×9.0 μm, a mask-substrate spacing will result in a deposition size of 3.0×9.5 μm, slightly smaller than the sub-pixel pitch of 3.2×9.6 μm but larger than the sub-pixel anode of 2.45×8.85 μm.

It was demonstrated that patterning with SNM is superior to thermal dye transfer methods. Variable associated with the use of SNM such as aperture density, aperture layout, SNM geometry, film thickness, and film type were addressed. Values found to be useful are: aperture density of around 25% for pixel pattern 2; 1 μm thick LPCVD silicon nitride film; and an area of approximately 19×12 mm. SNM area and film thickness were not an issue for this work when a 1 μm silicon nitride film was used as the mask. SNM was found to be fairly robust and was shown to withstand up to 180 g of weight before rupture. The SNM also exhibited the ability to be cleaned easily in organic solvents of the deposited organics. Lastly, the over etch of the silicon nitride during fabrication was addressed and the target SNM apertures were produced without over etch.

Alignment and motion control of the SNM relative to the substrate is an important component for patterning and was demonstrated. A digital microscope was used for alignment by positioning the apertures over their respective anodes on the substrate. The microscope also allowed for gap measurements through the use of focus height differences. For motion control, it was determined that a piezoelectric stage could enable sub-micron movements and to hold its position when the piezoelectric motors are not actuated. In addition, it was shown that vibration control was important to perform precise alignment of the SNM with the substrate. Much of the vibrational issues were resolved by integrating the microscope and the mask alignment system into one unit.

The patterning of the microdisplays with the SNM was performed where the SXGA display substrate was successfully patterned with the oversized SNM apertures. Accurate patterning was also achieved with the higher resolution WUXGA device when it was used in conjunction with a SNM without oversized apertures. As the offset source distance increases, the deposition shifts away from the targeted anode (away from the deposition source) when performed with a mask to substrate spacing of 13 μm. The shifting can be reduced with a reduction in the mask-substrate spacing.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. A method comprising:
    providing a shadow mask having a free-standing silicon nitride, silicon oxide, or aluminum oxide membrane; and
    forming a pattern of a first color emitter material on a substrate using the shadow mask, wherein the pattern of a first color emitter material has one or more first color emitter material structures having at least one dimension of less than 10 microns;
    forming a pattern of a second color emitter material on the substrate having the pattern of the first color emitter material using a second shadow mask having a free-standing silicon nitride, silicon oxide, or aluminum oxide membrane, wherein the pattern of the second color emitter material has one or more second color emitter material structures having at least one dimension of less than 10 microns; and
    forming a pattern of a third color emitter material on the substrate having the pattern of the first color emitter material and the pattern of the second color emitter material using a third shadow mask having a free-standing silicon nitride, silicon oxide, or aluminum oxide membrane, wherein the pattern of third color emitter material has one or more third color emitter material structures having at least one dimension of less than 10 microns.

2. The method of claim 1, wherein the first color emitter material structures and second color emitter material structures do not overlap.

3. The method of claim 1, wherein the first color emitter material structures and second color emitter material structures and third color emitter material structures do not overlap.

4. The method of claim 1, wherein the forming comprises deposition through the shadow mask using one of evaporation or sputtering.

5. The method of claim 1, wherein the substrate is part of an organic light-emitting diode.

6. The method of claim 1, wherein the shadow mask defines apertures having at least one dimension of 2.8 μm to 14 μm.

* * * * *